US011594587B2

(12) United States Patent
Son et al.

(10) Patent No.: US 11,594,587 B2
(45) Date of Patent: Feb. 28, 2023

(54) DISPLAY DEVICE

(71) Applicant: Samsung Display Co., Ltd., Yongin-si (KR)

(72) Inventors: Kyoung Seok Son, Seoul (KR); Myeong Ho Kim, Hwaseong-si (KR); Jay Bum Kim, Yongin-si (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 15/930,650

(22) Filed: May 13, 2020

(65) Prior Publication Data
US 2021/0066421 A1 Mar. 4, 2021

(30) Foreign Application Priority Data

Aug. 30, 2019 (KR) .................. 10-2019-0107175

(51) Int. Cl.
*H01L 27/32* (2006.01)
*H01L 51/52* (2006.01)
(Continued)

(52) U.S. Cl.
CPC ...... *H01L 27/3258* (2013.01); *H01L 27/1237* (2013.01); *H01L 27/1248* (2013.01); *H01L 51/5281* (2013.01); *H01L 51/56* (2013.01)

(58) Field of Classification Search
CPC ............ H01L 27/3258; H01L 27/1237; H01L 27/1248
(Continued)

(56) References Cited

U.S. PATENT DOCUMENTS 9,129,927 B2 *  9/2015  Gupta ................. H01L 27/3262
2011/0175535 A1 *  7/2011  Makita .................. G02F 1/1368
438/164

(Continued)

FOREIGN PATENT DOCUMENTS

JP          2018-74076 A    5/2018
KR   10-2014-0102561 A    8/2014
(Continued)

*Primary Examiner* — Dzung Tran
(74) *Attorney, Agent, or Firm* — Lewis Roca Rothgerber Christie LLP

(57) ABSTRACT

A display device includes a substrate, a first semiconductor layer on the substrate, a first gate insulating film on the first semiconductor layer, a first conductive layer on the first gate insulating film and including a first gate electrode and a first electrode of a capacitor connected to the first gate electrode, a second semiconductor layer on the first gate insulating film and at a different layer from the first semiconductor layer, a second gate insulating film on the first conductive layer and the second semiconductor layer, a second conductive layer on the second gate insulating film and including a second gate electrode and a second electrode of the capacitor, a second interlayer insulating film on the second conductive layer, and a third conductive layer on the second interlayer insulating film and including a first source electrode, a first drain electrode, a second source electrode, and a second drain electrode.

13 Claims, 25 Drawing Sheets

(51) Int. Cl.
*H01L 51/56* (2006.01)
*H01L 27/12* (2006.01)

(58) Field of Classification Search
USPC .......................................................... 257/79
See application file for complete search history.

(56) References Cited

U.S. PATENT DOCUMENTS

| | | | |
|---|---|---|---|
| 2013/0092927 A1 | 4/2013 | Murai et al. | |
| 2015/0123084 A1* | 5/2015 | Kim | H01L 27/1251 |
| | | | 257/43 |
| 2016/0307988 A1* | 10/2016 | Kim | H01L 27/1237 |
| 2017/0141169 A1* | 5/2017 | Sim | H01L 27/3258 |
| 2017/0365649 A1* | 12/2017 | Kim | H01L 27/3246 |
| 2018/0277614 A1* | 9/2018 | Ono | H01L 27/1248 |
| 2019/0006521 A1* | 1/2019 | Noh | H01L 29/78618 |

FOREIGN PATENT DOCUMENTS

| | | |
|---|---|---|
| KR | 10-2018-0030275 A | 3/2018 |
| KR | 10-2018-0119192 A | 11/2018 |
| KR | 10-2019-0028589 A | 3/2019 |

* cited by examiner

Fig. 2
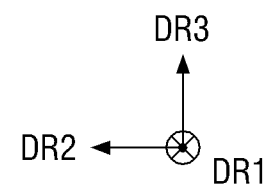

DISPLAY DEVICE

CROSS-REFERENCE TO RELATED APPLICATION

This application claims priority to and the benefit of Korean Patent Application No. 10-2019-0107175 filed on Aug. 30, 2019, in the Korean Intellectual Property Office (KIPO), the disclosure of which is incorporated herein by reference in its entirety.

BACKGROUND

1. Field

One or more embodiments of the present disclosure relate to a display device.

2. Description of the Related Art

Display devices are becoming increasingly important with the development of multimedia. In response to this, various types of display devices such as liquid crystal displays (LCDs), organic light-emitting diode (OLED) displays, and the like are being used. Among the display devices, the OLED display displays an image using OLEDs that generate light by recombining electrons and holes. The OLED display includes a plurality of transistors that provide a driving current to the OLED.

SUMMARY

One or more aspects of embodiments of the present disclosure are directed toward a display device in which the number of masks used in a manufacturing process is reduced.

One or more aspects of embodiments of the present disclosure are directed toward a method of manufacturing a display device in which the number of masks used in a manufacturing process is reduced.

The scope of the present disclosure is not limited to the above-described objects, and other unmentioned objects may be clearly understood by those skilled in the art from the following descriptions.

One or more example embodiments of the present disclosure provide a display device including a substrate, a first semiconductor layer on the substrate, a first gate insulating film on the first semiconductor layer, a first conductive layer on the first gate insulating film and including a first gate electrode and a first electrode of a capacitor connected to the first gate electrode, a second semiconductor layer on the first gate insulating film and at a different semiconductor layer from the first semiconductor layer, a second gate insulating film on the first conductive layer and the second semiconductor layer, a second conductive layer on the second gate insulating film and including a second gate electrode and a second electrode of the capacitor, a second interlayer insulating film on the second conductive layer, and a third conductive layer on the second interlayer insulating film and including a first source electrode and a first drain electrode connected to the first semiconductor layer and a second source electrode and a second drain electrode connected to the second semiconductor layer.

One or more example embodiments of the present disclosure provide a method of manufacturing a display device including forming a first semiconductor layer of a first transistor on a substrate, forming a first gate insulating film on the first semiconductor layer, forming a first gate electrode and a first electrode of a capacitor connected to the first gate electrode on the first gate insulating film, wherein each of the first gate electrode and the first electrode of the capacitor is formed of a first conductive layer, forming a second semiconductor layer of a second transistor on the first gate insulating film, the second semiconductor layer being at a different layer from the first semiconductor layer, forming a second gate insulating film on the second semiconductor layer of the second transistor and forming a second conductive layer on the second gate insulating film, wherein the second conductive layer includes a second electrode of the capacitor and a second gate electrode.

According to one or more embodiments of the display device and one or more embodiments of the method of manufacturing a display device, the number of masks can be reduced, thereby reducing process costs and increasing process efficiency.

Effects according to one or more embodiments of the present disclosure are not limited by the content exemplified above, and various other effects are described in the specification.

BRIEF DESCRIPTION OF THE DRAWINGS

The above and other aspects and features of the present disclosure will become more apparent by describing exemplary embodiments thereof in detail with reference to the attached drawings, in which:

FIG. 2 is a side view of the display device of FIG. 1;

DETAILED DESCRIPTION

Figure 1:
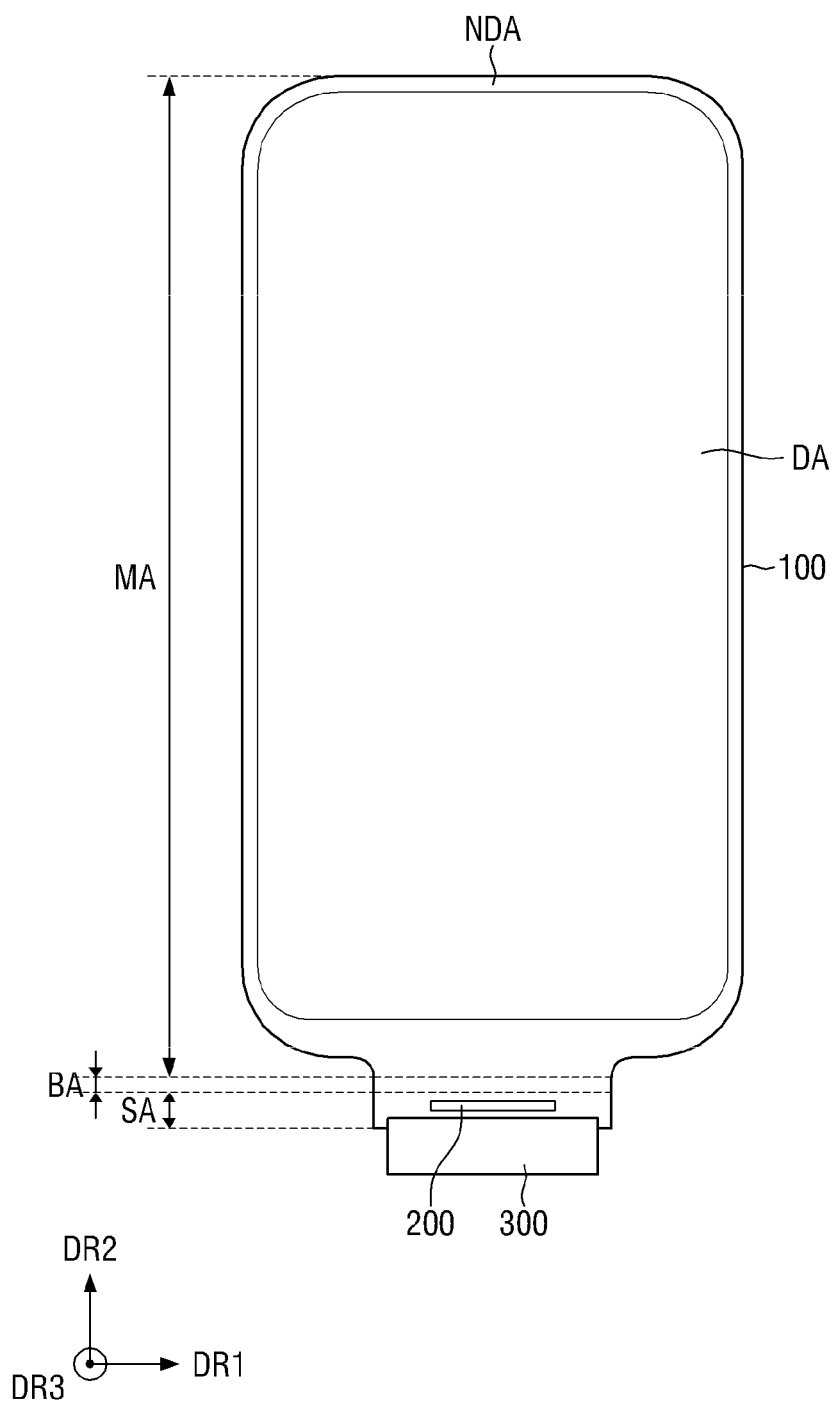
FIG. 1 is a plan view of a display device according to an embodiment.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

As used herein, the phrases such as "a plan view" may refer to a view from top or from a direction normal to the display area (or display plane) of the display device.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. Further, when an element is described as "above" another element, the element may be farther from a base substrate of the display device than the other element along a direction perpendicular to the base substrate. When an element is described as "below" another element, the element may be closer to the base substrate of the display device than the other element along a direction perpendicular to the base substrate.

As used herein, the terms "substantially" and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the detailed description, those skilled in the art will appreciate that many variations and modifications can be made to the disclosed embodiments without substantially departing from the principles of the present invention. Therefore, the disclosed embodiments of the invention are used in a generic and descriptive sense only and not for purposes of limitation.

Hereinafter, specific embodiments will be described with reference to the accompanying drawings.

FIG. 1 is a plan view of a display device according to an embodiment. FIG. 2 is a side view of the display device of FIG. 1. FIG. 2 illustrates a shape of a side surface of the display device which is bent in a thickness direction thereof.

A display device 1 may be a device for displaying moving images or still images, and the display device 1 may be used for display screens of portable electronic devices, such as mobile phones, smart phones, tablet personal computers (PCs), smart watches, watch phones, mobile communication terminals, electronic notebooks, e-books, portable multimedia players (PMPs), navigation systems, and ultra-mobile PCs (UMPCs), and also used for display screens of various products such as televisions, laptop computers, monitors, billboards, and Internet of Things devices.

The display device 1 according to one or more embodiments may have a substantially rectangular shape in a plan view. The display device 1 may have a rectangular shape of which the angles at the corners of the rectangular shape are right angles in a plan view. However, the present disclosure is not limited thereto, and the display device 1 may have a rectangular shape of which corners are round or curved in a plan view.

In the drawings, a first direction DR1 represents a lateral direction of the display device 1 in a plan view and a second direction DR2 represents a longitudinal direction of the display device 1 in the plan view. In addition, a third direction DR3 represents the thickness direction of the display device 1. The first direction DR1 and the second direction DR2 cross each other perpendicularly, and the third direction DR3 is a direction crossing a plane in which the first direction DR1 and the second direction DR2 are placed and crosses perpendicularly to both of the first direction DR1 and the second direction DR2. However, directions to be described in embodiments should be understood to refer to relative directions and the embodiments are not limited to the described directions.

Unless otherwise defined, in this specification, the term "upper portion," "upper surface," or "upper side" represented with respect to the third direction DR3 refer to a direction of a display surface (e.g., a surface of the display panel through which the display panel 100 emits light to display images) with respect to a display panel 100, and the terms "lower portion," "lower surface," or "lower side" refer to a direction opposite to the display surface with respect to the display panel 100.

Referring to FIGS. 1 and 2, the display device 1 may include the display panel 100. The display panel 100 may be a flexible substrate including a flexible polymer material such as polyimide or the like. Accordingly, the display panel 100 may be flexible, bendable, foldable, or rollable.

The display panel 100 may be an organic light-emitting display panel. In one or more embodiments, an organic light-emitting display panel is illustrated as the display panel 100, but the present disclosure is not limited thereto, and other types of display panels, such as a liquid crystal display (LCD), a quantum dot organic light-emitting display (QD-OLED) panel, a quantum dot LCD (QD-LCD), a quantum nano light-emitting display panel (a nano-emmisive display (NED)), a micro LED, and the like may be applied as the display panel 100.

The display panel 100 may include a display region DA in which a screen is displayed (e.g., an image is displayed) and a non-display region NDA in which the screen is not displayed (e.g., no image is displayed). The display panel 100 may be divided into the display region DA and the non-display region NDA in the plan view. The non-display region NDA may be disposed to surround the display region DA. The non-display region NDA may form a bezel.

The display region DA may have a rectangular shape of which the angles at the corners of the rectangular shape are a right angle in the plan view. In one or more embodiments, the display region DA may have a rectangular shape of which the angles at the corners of the rectangular shape are round or curved in the plan view. The display region DA may have short sides and long sides. Each of the long sides may be longer than each of the short sides. The short sides of the display region DA may be sides extending in the first direction DR1. The long sides of the display region DA may be sides extending in the second direction DR2. However, a planar shape of the display region DA is not limited to a rectangular shape, and the display region DA may be a circular shape, an elliptical shape, or various other suitable shapes.

The display region DA may include a plurality of pixels. The pixels may be arranged in a matrix form. Each of the pixels may include a light-emitting layer and a circuit layer which controls a light emission amount of the light-emitting layer. The circuit layer may include a line, an electrode, and at least one transistor. The light-emitting layer may include an organic light-emitting material. The light-emitting layer may be sealed by an encapsulation film. A detailed configuration of the pixel will be described in more detail below.

The non-display region NDA may be disposed adjacent to two short sides and two long sides of the display region DA. In this case, the non-display region NDA may surround all of the sides of the display region DA and form an edge (e.g., an outer edge) of the display region DA. However, the present disclosure is not limited thereto, and the non-display region NDA may be disposed adjacent to only two short sides or two long sides of the display region DA.

The display panel 100 may include a main region MA and a bending region BA connected to one side of the main region MA in the second direction DR2. The display panel 100 may further include a subregion SA of which one side is connected to the bending region BA in the second direction DR2 and which is bent in the thickness direction thereof to overlap the main region MA in the thickness direction.

The display region DA may be located in the main region MA. The non-display region NDA may be located at a peripheral edge portion of the display region DA of the main region MA.

The main region MA may have a shape similar to that of an exterior of the display device 1 in the plan view. The main region MA may be a flat region located in one surface. In other words, the main region MA may be a region located in a substantially flat planar surface of the display device 1 as illustrated in FIG. 1. However, the present disclosure is not limited thereto, and at least one of the remaining edges except for the edge (side) of the main region MA connected to the bending region BA may be curved to form a curved surface or may be bent in a perpendicular direction.

When at least one of the remaining edges except for the edge (side) of the main region MA connected to the bending region BA is curved or bent, the display region DA may also be disposed at the corresponding edge. However, the present disclosure is not limited thereto, and the non-display region NDA in which the screen is not displayed may be disposed at the curved or bent edge, or the display region DA and the non-display region NDA may be disposed together at the curved or bent edge.

The non-display region NDA of the main region MA may be placed in a region extending from an outer boundary of the display region DA to the edge of the display panel 100. Signal lines for applying signals to the display region DA or driving circuits may be disposed in the non-display region NDA of the main region MA.

The bending region BA may be connected to one short side of the main region MA. A width (a width in the first direction DR1) of the bending region BA may be smaller (or less) than a width (a width of the short side) of the main region MA. A connection portion between the main region MA and the bending region BA may have an L-shaped cut shape in order to reduce a width of a bezel.

In the bending region BA, the display panel 100 may be bent with a curvature in a direction opposite to a direction of a display surface (e.g., a direction that the display surface faces) thereof. Because the display panel 100 is bent in the bending region BA, a surface (e.g., subregion SA) of the display panel 100 may be reversed. That is, one surface of the display panel 100 facing upward may face an outer side of a side surface of the display panel 100 through the bending region BA and then may be changed to face downward.

The subregion SA extends from the bending region BA. The subregion SA may extend from a bending end point in a direction parallel to the main region MA. The subregion SA may overlap the main region MA in the thickness direction of the display panel 100. The subregion SA may overlap the non-display region NDA at the edge of the main region MA and may further overlap the display region DA of the main region MA. A width of the subregion SA may be identical, equal to, or substantially equal to the width of the bending region BA, but the present disclosure is not limited thereto. For example, in one or more embodiments, the subregion SA and the bending region BA may have different widths.

Pad portions may be disposed on the subregion SA of the display panel 100. External devices may be mounted on (or attached to) the pad portions. Examples of the external device may include a driving chip 200, a driving substrate 300 formed as a flexible printed board or a rigid printed board, and the like. In addition, a line connection film, a connector, and the like may be mounted on the pad portions as the external devices. One or more external devices may be mounted in the subregion SA. For example, as illustrated in FIGS. 1 and 2, the driving chip 200 may be disposed in the subregion SA of the display panel 100, and the driving substrate 300 may be attached to an end portion of the subregion SA. In this case, the display panel 100 may include both of a pad portion connected to the driving chip 200 and a pad portion connected to the driving substrate 300. As another example, a driving chip may be mounted on a film, and the film may be attached to the subregion SA of the display panel 100.

The driving chip 200 may be mounted on one surface of the display panel 100. In one or more embodiments, the one surface of the display panel 100 is coplanar with the display surface of the display panel 100 (e.g., the driving chip 200 is mounted on the same surface of the display panel 100 as the display surface). As described above, due to the bending region BA being bent and reversed, the driving chip 200 may be mounted on the surface of the display panel 100 facing downward in the thickness direction (or away from the display region DA) and thus an upper surface of the driving chip 200 may face downward.

The driving chip 200 may be attached onto the display panel 100 using an anisotropic conductive film or may be attached onto the display panel 100 by ultrasonic bonding. A lateral width of the driving chip 200 may be smaller (or less than) than a lateral width of the display panel 100. The driving chip 200 may be disposed on a central portion of the subregion SA in a lateral direction (the first direction DR1), and left and right edges of the driving chip 200 may be spaced apart from left and right edges of the subregion SA, respectively.

The driving chip 200 may include an integrated circuit which drives the display panel 100. In one or more embodiments, the integrated circuit may be a data driving integrated circuit which generates and provides a data signal, but the present disclosure is not limited thereto. The driving chip 200 is connected to line pads provided on the pad portions of the display panel 100 to provide data signals to the line pads. The lines connected to the line pads extend to the pixels to apply the data signals to the respective pixels.

Figure 3:
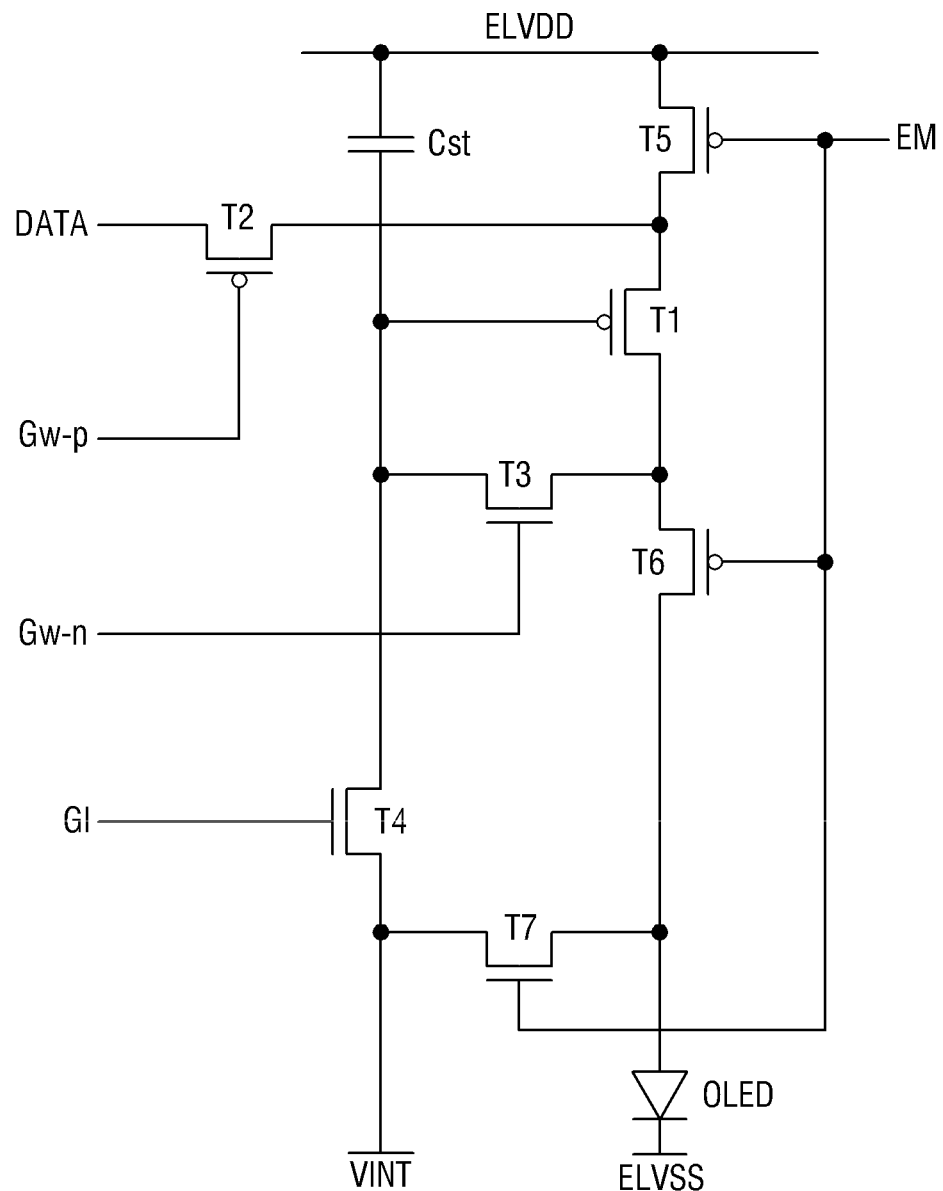
FIG. 3 is an equivalent circuit diagram of one pixel of a display device according to an embodiment.

FIG. 3 is an equivalent circuit diagram of a display device according to an embodiment.

Referring to FIG. 3, a circuit of one pixel of an organic light-emitting display device includes an organic light-emitting diode OLED, a plurality of transistors T1 to T7 (T1, T2, T3, T4, T5, T6, and T7), and a capacitor Cst. A data signal DATA, a first scan signal Gw-p, a second scan signal Gw-n, a third scan signal GI, a light-emitting control signal EM, a first power voltage ELVDD, a second power voltage ELVSS, and an initialization voltage VINT are applied to the circuit of the pixel.

The organic light-emitting diode OLED includes an anode electrode and a cathode electrode. The capacitor Cst includes a first electrode and a second electrode.

The plurality of transistors may include first to seventh transistors (first, second, third, fourth, fifth, sixth, and seventh transistors) T1 to T7. Each of the transistors T1 to T7 includes a gate electrode, a first source/drain electrode, and a second source/drain electrode. Any one of the first and second source/drain electrodes of each of the transistors T1 to T7 may be a source electrode and the other one may be a drain electrode.

Each of the transistors T1 to T7 may be a thin film transistor. Each of the transistors T1 to T7 may be any one of a p-type metal-oxide-semiconductor (PMOS) transistor and an n-type metal-oxide-semiconductor (NMOS) transistor. In one or more embodiments, a first transistor T1 serving as a driving transistor, a second transistor T2 serving as a data transfer transistor, a fifth transistor T5 serving as a first light-emitting control transistor, and a sixth transistor T6 serving as a second light-emitting control transistor may be PMOS transistors (e.g., in the embodiment shown in FIG. 3). On the other hand, a third transistor T3 serving as a compensation transistor, a fourth transistor T4 serving as a first initialization transistor, and a seventh transistor T7 serving as a second initialization transistor may be NMOS transistors (e.g., in the embodiment shown in FIG. 3). The PMOS transistor and the NMOS transistor have different characteristics. The third transistor T3, the fourth transistor T4, and the seventh transistor T7 may be formed as NMOS transistors having relatively high turn-off characteristics, and thus a leakage of a driving current Id during an emission period of the organic light-emitting diode OLED may be reduced.

Hereinafter, each component will be described in more detail in accordance with one or more embodiments.

The gate electrode of the first transistor T1 is connected to the first electrode of the capacitor Cst. The first source/drain electrode of the first transistor T1 is connected to a terminal of the first power voltage ELVDD via the fifth transistor T5. The second source/drain electrode of the first transistor T1 is connected to the anode electrode of the organic light-emitting diode OLED via the sixth transistor T6. The first transistor T1 receives the data signal DATA according to a switching operation of the second transistor T2 and supplies a driving current Id corresponding to the data signal DATA to the organic light-emitting diode OLED.

The gate electrode of the second transistor T2 is connected to a terminal of the first scan signal Gw-p. The first source/drain electrode of the second transistor T2 is connected to a terminal of the data signal DATA. The second source/drain electrode of the second transistor T2 is connected to the terminal of the first power voltage ELVDD via the fifth transistor T5 while being connected to the first source/drain electrode of the first transistor T1. The second transistor T2 is turned on according to the first scan signal Gw-p to perform the switching operation in which the data signal DATA is transmitted to the first source/drain electrode of the first transistor T1.

The gate electrode of the third transistor T3 is connected to a terminal of the second scan signal Gw-n. The first source/drain electrode of the third transistor T3 is connected to the anode electrode of the organic light-emitting diode OLED via the sixth transistor T6 while being connected to the second source/drain electrode of the first transistor T1. The second source/drain electrode of the third transistor T3 is connected to the first electrode of the capacitor Cst, the first source/drain electrode of the fourth transistor T4, and the gate electrode of the first transistor T1. The third transistor T3 is turned on according to the second scan signal Gw-p to connect the gate electrode of the first transistor T1 to the second source/drain electrode and diode-connect the first transistor T1. Accordingly, a voltage difference is generated between the first source/drain electrode of the first transistor T1 and the gate electrode by a threshold voltage of the first transistor T1. Therefore, the data signal DATA may be supplied to the gate electrode of the first transistor T1 in a manner that compensates for a deviation of the threshold voltage of the first transistor T1.

The gate electrode of the fourth transistor T4 is connected to a terminal of the third scan signal GI. The second source/drain electrode of the fourth transistor T4 is connected to a terminal of the initialization voltage VINT. The first source/drain electrode of the fourth transistor T4 is connected to the first electrode of the capacitor Cst, the second source/drain electrode of the third transistor T3, and the gate electrode of the first transistor T1. The fourth transistor T4 is turned on according to the third scan signal GI to perform an operation in which the initialization voltage VINT is transmitted to the gate electrode of the first transistor T1 so that a voltage of the gate electrode of the first transistor T1 is initialized.

The gate electrode of the fifth transistor T5 is connected to a terminal of the light-emitting control signal EM. The first source/drain electrode of the fifth transistor T5 is connected to the terminal of the first power voltage ELVDD. The second source/drain electrode of the fifth transistor T5 is connected to the first source/drain electrode of the first transistor T1 and the second source/drain electrode of the second transistor T2.

The gate electrode of the sixth transistor T6 is connected to the terminal of the light-emitting control signal EM. The first source/drain electrode of the sixth transistor T6 is connected to the second source/drain electrode of the first transistor T1 and the first source/drain electrode of the third transistor T3. The second source/drain electrode of the sixth transistor T6 is connected to the anode electrode of the organic light-emitting diode OLED.

The fifth transistor T5 and the sixth transistor T6 are turned on concurrently (e.g., simultaneously) according to the light-emitting control signal EM so that the driving current Id flows into (or through) the organic light-emitting diode OLED.

The gate electrode of the seventh transistor T7 is connected to the terminal of the light-emitting control signal EM. The first source/drain electrode of the seventh transistor T7 is connected to the anode electrode of the organic light-emitting diode OLED. The second source/drain electrode of the seventh transistor T7 is connected to the terminal of the initialization voltage VINT. The seventh transistor T7 is turned on according to the light-emitting control signal EM to initialize the anode electrode of the organic light-emitting diode OLED.

The seventh transistor T7 receives the same light-emitting control signal EM as the fifth transistor T5 and the sixth transistor T6. However, because the seventh transistor T7 is the NMOS transistor and the fifth transistor T5 and the sixth transistor T6 are the PMOS transistors, the seventh transistor T7 may be turned on at a different timing from the fifth transistor T5 and the sixth transistor T6. That is, when the light-emitting control signal EM is a high level, the seventh transistor T7 is turned on and the fifth transistor T5 and the sixth transistor T6 are turned off. When the light-emitting control signal EM is a low level, the seventh transistor T7 is turned off and the fifth transistor T5 and the sixth transistor T6 are turned on. Therefore, the initialization operation by the seventh transistor T7 may not be performed at an emission time point at which the fifth transistor T5 and the sixth transistor T6 are turned on, and the initialization by the seventh transistor T7 may be performed at a non-emission time point at which the fifth transistor T5 and the sixth transistor T6 are turned off.

In the illustrated embodiment of FIG. 3, an example in which the gate electrode of the seventh transistor T7 receives the light-emitting control signal EM is illustrated. However, in one or more embodiments, the circuit of the pixel may be configured such that the gate electrode of the seventh transistor T7 receives the third scan signal GI.

The second electrode of the capacitor Cst is connected to the terminal of the first power voltage ELVDD. The first electrode of the capacitor Cst is connected to the gate electrode of the first transistor T1, the second source/drain electrode of the third transistor T3, and the first source/drain electrode of the fourth transistor T4. The cathode electrode of the organic light-emitting diode OLED is connected to the terminal of the second power voltage ELVSS. The organic light-emitting diode OLED receives the driving current Id from the first transistor T1 and emits light to display an image.

Figure 4:
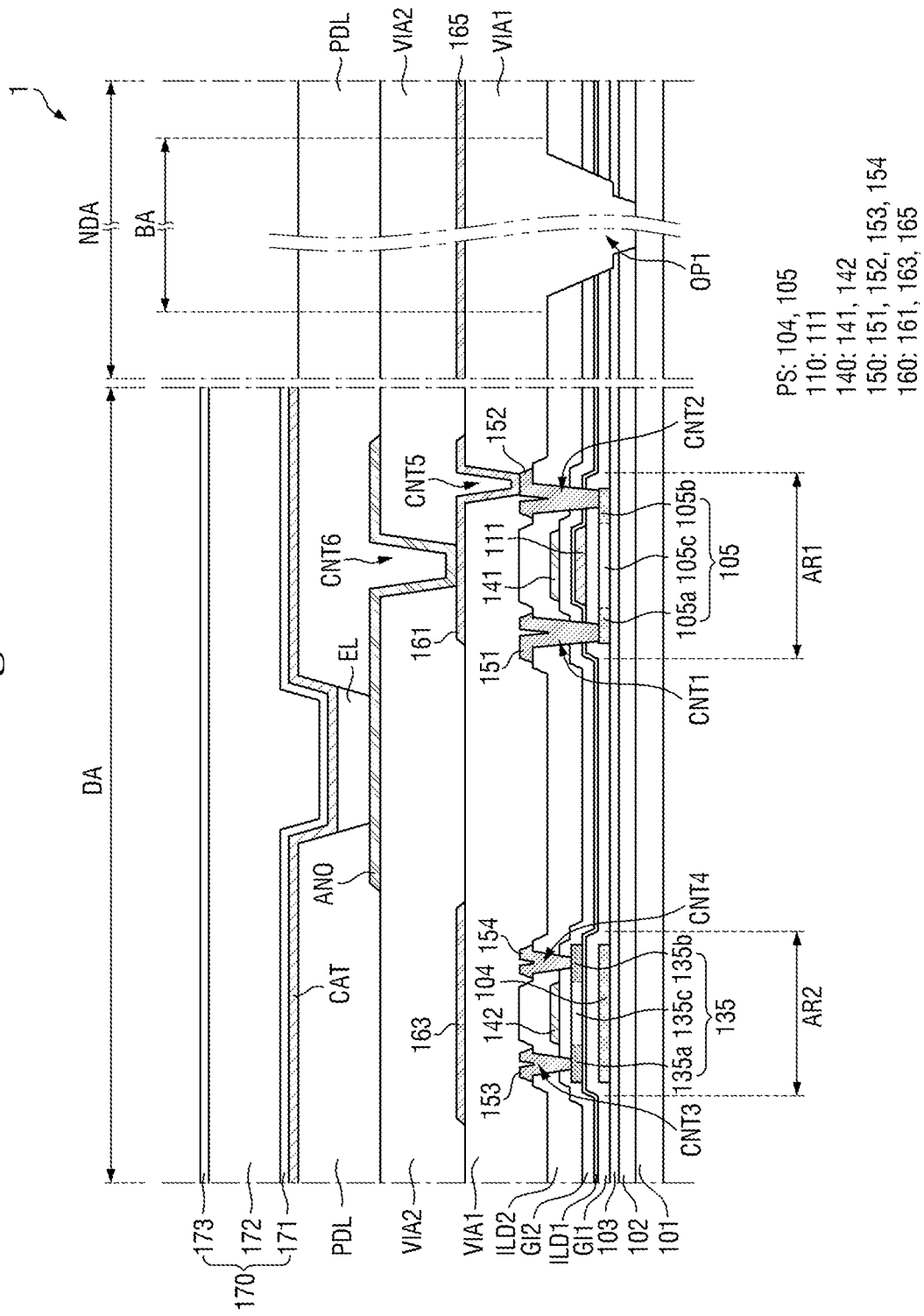
FIG. 4 is a cross-sectional view illustrating an exemplary cross section of one pixel and a periphery of a bending region of a non-display region according to an embodiment.

Hereinafter, a cross-sectional structure of a display panel 100 will be described in detail with reference to FIG. 4. FIG. 4 illustrates an example of a cross-sectional structure of one pixel of a display region DA of the display panel 100 and a non-display region NDA including a bending region BA.

FIG. 4 is a cross-sectional view illustrating an example cross section of a pixel of a display region and a periphery of a bending region of a non-display region according to an embodiment.

First, the display region DA of the display panel 100 will be described with reference to FIG. 4.

The display region DA may include a silicon transistor region AR1 in which a non-oxide inorganic semiconductor transistor (hereinafter, abbreviated as "a silicon transistor") including polycrystalline silicon serving as a channel is disposed, and an oxide transistor region AR2 in which an oxide semiconductor transistor (hereinafter, abbreviated as "an oxide transistor") including an oxide semiconductor serving as a channel is disposed. The silicon transistor disposed in the silicon transistor region AR1 may be a PMOS transistor, and in FIG. 4, a first transistor T1 serving as a driving transistor is illustrated as an example of the silicon transistor. The oxide transistor disposed in the oxide transistor region AR2 may be an NMOS transistor, and in FIG. 4, a third transistor T3 serving as a compensation transistor is illustrated as an example of the oxide transistor. In one or more embodiments, a second transistor T2, a fifth transistor T5, and a sixth transistor T6, which are other silicon transistors disposed in the silicon transistor region AR1, may have substantially the same stacked structure as the first transistor T1, and a fourth transistor T4 and a seventh transistor T7, which are other oxide transistors disposed in the oxide transistor region AR2, may have substantially the same stacked structure as the third transistor T3. The silicon transistor and the oxide transistor will be described in more detail below.

A base substrate 101, a barrier layer 102, a buffer layer 103, a silicon semiconductor pattern PS including a silicon lower light-shielding pattern 104 and a silicon semiconductor layer 105, a first gate insulating film GI1, a first conductive layer 110, a first interlayer insulating film ILD1, an oxide semiconductor layer 135, a second gate insulating film GI2, a second conductive layer 140, a second interlayer insulating film ILD2, a third conductive layer 150, a first via layer VIA1, a fourth conductive layer 160, a second via layer VIA2, anode electrodes ANO, and a pixel definition film PDL may be sequentially disposed or stacked in the display region DA of the display panel 100. Each of the above-described layers may be formed as a single film or may be formed as a stacked film including a plurality of films. In one or more embodiments, another layer may be further disposed between the layers.

The base substrate 101 supports the respective layers disposed thereabove. The base substrate 101 may be made of, for example, an insulating material such as a polymer resin and/or the like. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate which is bendable, foldable, or rollable. An example of the material forming the flexible substrate may include PI, but the present disclosure is not limited thereto.

When an organic light-emitting display device is a backside or double-sided emission type, a transparent substrate may be used. When the organic light-emitting display device is a top emission type, a transparent, translucent, and/or opaque substrate may be used.

The barrier layer 102 may be disposed on the base substrate 101. The barrier layer 102 may prevent or reduce the diffusion of impurity ions, prevent or reduce the penetration of moisture or external air, and perform a surface planarization function. The barrier layer 102 may include silicon nitride, silicon oxide, silicon oxynitride, or the like. The barrier layer 102 may be omitted according to a type of the base substrate 101, process conditions, or the like.

The buffer layer 103 may be disposed on the barrier layer 102. The buffer layer 103 may include at least one of silicon nitride, silicon oxide, silicon oxynitride, and the like. The buffer layer 103 may be omitted in one or more embodiments according to the type of the base substrate 101, the process conditions, or the like.

The silicon semiconductor pattern PS may be disposed on the buffer layer 103. The silicon semiconductor pattern PS may be made of polycrystalline silicon, single crystalline silicon, amorphous silicon, or the like. The silicon semiconductor pattern PS may include the silicon lower light-shielding pattern 104 and the silicon semiconductor layer 105. The silicon lower light-shielding pattern 104 and the silicon semiconductor layer 105 may be made of the same material and may be formed to be coplanar. In other words, the lower light-shielding pattern 104 and the silicon semiconductor layer 105 may be disposed to be coplanar (e.g., disposed on the buffer layer 103). The silicon lower light-shielding pattern 104 may be disposed in the oxide transistor region AR2 and the silicon semiconductor layer 105 may be disposed in the silicon transistor region AR1. For example, in one or more embodiments, the silicon lower-light shielding pattern is not disposed in the silicon transistor region AR1.

The silicon lower light-shielding pattern 104 may be located below the oxide semiconductor layer 135 to serve to prevent or substantially prevent light incident from a lower direction of the display panel 100 from entering the oxide semiconductor layer 135 disposed above the silicon lower light-shielding pattern 104. The silicon lower light-shielding pattern 104 may at least overlap (e.g., in a thickness direction) a channel region 135c of the oxide semiconductor layer 135. In one or more embodiments, the silicon lower light-shield pattern 104 may overlap (e.g., in a thickness direction) the entire oxide semiconductor layer 135 in a cross-sectional view as illustrated in FIG. 4.

In one or more embodiments, the silicon lower light-shielding pattern 104 may be used as another gate electrode of the oxide transistor. In this case, the silicon lower light-shielding pattern 104 may be connected to a second gate electrode 142. In one or more embodiments, the silicon lower light-shielding pattern 104 may be connected (e.g., electrically connected) to any one of a first source/drain electrode 153 and a second source/drain electrode 154 of a transistor disposed in the oxide transistor region AR2.

The silicon semiconductor layer 105 may be made of polycrystalline silicon. In this case, the polycrystalline silicon may be formed by crystallizing amorphous silicon using a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like.

The silicon semiconductor layer 105 may include a channel region 105c disposed to overlap a first gate electrode 111 thereabove in the thickness direction thereof, and a first source/drain region 105a and a second source/drain region 105b of the silicon semiconductor layer 105 which are respectively located on one side and the other side of the channel region 105c. The first and second source/drain regions 105a and 105b of the silicon semiconductor layer 105 may include a plurality of carrier ions and thus may have higher conductivity and lower electrical resistance than the channel region 105c.

The silicon semiconductor layer 105 may be a semiconductor layer of each of the first transistor T1, the second transistor T2, the fifth transistor T5, and the sixth transistor T6, which are described above, and may form a channel of the corresponding transistor.

The first gate insulating film Gi1 may be disposed on the silicon semiconductor pattern PS. The first gate insulating film Gi1 may include a silicon compound, a metal oxide, or the like. For example, the first gate insulating film Gi1 may include silicon oxide, silicon nitride, silicon oxynitride, aluminum oxide, tantalum oxide, hafnium oxide, zirconium oxide, titanium oxide, or the like. The above materials may be used alone or in combinations thereof.

The first gate insulating film Gi1 may cover an upper surface of the silicon semiconductor layer 105 except for portions in which contact holes CNT1 and CNT2 are formed and, in one or more embodiments, the first gate insulating film Gi1 also covers side surfaces of the silicon semiconductor layer 105. Further, the first gate insulating film Gi1 may cover an upper surface and a side surface of the silicon lower light-shielding pattern 104. In one or more embodiments, the first gate insulating film Gi1 may be disposed roughly or substantially over an entire surface of the base substrate 101.

The first conductive layer 110 is disposed on the first gate insulating film GI1. The first conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and copper (Cu). The first conductive layer 110 may be a single film or a multilayer film.

The first conductive layer 110 may include the first gate electrode 111 disposed in the silicon transistor region AR1.

The first gate electrode 111 may be a gate electrode of the silicon transistor. The first gate electrode 111 may be connected to the first electrode of the capacitor Cst. The first electrode of the capacitor Cst may be formed using the first gate electrode 111 itself or may be formed using a portion extending from the first gate electrode 111. Accordingly, a portion of a pattern of the integrated first conductive layer may include the first gate electrode 111 and the first electrode of the capacitor Cst. For example, a portion of a pattern of the integrated first conductive layer may overlap the silicon semiconductor layer 105 to function as the first gate electrode 111 at the corresponding portion, and another portion of the pattern may not overlap the silicon semiconductor layer 105 to function as the first electrode of the capacitor Cst which overlaps a second electrode 141 of the capacitor Cst thereabove. As another example, a portion of a pattern of the integrated first conductive layer may overlap the silicon semiconductor layer 105 to function as both the first gate electrode 111 and as the first electrode of the capacitor Cst.

The first interlayer insulating film ILD1 is disposed on the first conductive layer 110. The first interlayer insulating film ILD1 may include a silicon compound, a metal oxide, and/or the like. For example, the first interlayer insulating film ILD1 may include silicon oxide, silicon nitride, silicon oxynitride, aluminum oxide, tantalum oxide, hafnium oxide, zirconium oxide, titanium oxide, and/or the like. The above materials may be used alone or in combinations thereof.

The first interlayer insulating film ILD1 may be disposed on the first conductive layer 110 including the first gate electrode 111 to serve to prevent or substantially prevent the first conductive layer 110 from being oxidized by a subsequent process (e.g., high temperature activation of the silicon semiconductor layer 105). A thickness of the first interlayer insulating film ILD1 may be smaller (or less) than a thickness of each of the first gate insulating film Gil and the second gate insulating film GI2.

The oxide semiconductor layer 135 is disposed on the first interlayer insulating film ILD1. The oxide semiconductor layer 135 may be disposed in the oxide transistor region AR2. The oxide semiconductor layer 135 may include an oxide semiconductor. The oxide semiconductor may include one or more oxides selected from gallium indium zinc oxide (GIZO), zinc (Zn), indium (In), gallium (Ga), tin (Sn) cadmium (Cd), germanium (Ge), hafnium (Hf), and a combination thereof. The oxide semiconductor may include at least one of indium gallium zinc oxide (IGZO), zinc tin oxide (ZTO), indium tin oxide (IZO), and the like.

The oxide semiconductor layer 135 may include the channel region 135c disposed to overlap the second gate electrode 142 thereabove in the thickness direction thereof and a first source/drain region 135a and a second source/drain region 135b of the oxide semiconductor layer 135 which are respectively located on one side and the other side of the channel region 135c. The first and second source/drain regions 135a and 135b of the oxide semiconductor layer 135 may be conductive regions and may have higher conductivity and lower electrical resistance than the channel region 135c.

The oxide semiconductor layer 135 may be a semiconductor layer of each of the third transistor T3, the fourth transistor T4, and the seventh transistor T7, which are described above, and may form a channel of the corresponding transistor.

The second gate insulating film GI2 is disposed on the oxide semiconductor layer 135. The second gate insulating film GI2 may include a silicon compound, a metal oxide, or the like. For example, the second gate insulating film GI2 may include silicon oxide, silicon nitride, silicon oxynitride, aluminum oxide, tantalum oxide, hafnium oxide, zirconium oxide, titanium oxide, or the like. The above materials may be used alone or in combinations thereof.

The second gate insulating film GI2 may cover an upper surface of the oxide semiconductor layer 135 except for portions in which contact holes CNT3 and CNT4 are formed and the second gate insulating film GI2 may also cover side surfaces of the oxide semiconductor layer 135. The second gate insulating film GI2 may be disposed roughly or extend substantially over the entire surface of the base substrate 101.

In one or more embodiments, the second gate insulating film GI2 may perform different functions according to a position thereof. For example, a portion of the second gate insulating film GI2 located in the oxide transistor region AR2 may be disposed between the oxide semiconductor layer 135 and the second gate electrode 142 to function as a gate insulating film of the oxide transistor. In one or more embodiments, a portion of the second gate insulating film GI2 located in a region (of the silicon transistor region AR1) which overlaps (e.g., in a thickness direction) the second electrode 141 of the capacitor Cst and the first electrode of the capacitor Cst connected to the first gate electrode 111 may serve as a dielectric of the capacitor Cst with another insulating layer (e.g., the first interlayer insulating film ILD1) between the second electrode 141 of the capacitor Cst and the first electrode of the capacitor Cst connected to the first gate electrode 111. That is, the second electrode 141 of the capacitor Cst and the first electrode of the capacitor Cst connected to the first gate electrode 111 may form the capacitor Cst while facing each other with the second gate insulating film GI2 interposed therebetween in a region overlapping each other. In one or more embodiments, the oxide semiconductor layer 135 of the transistor disposed in the oxide transistor region AR2 may be located below a portion of the second gate insulating film GI2 and another portion of the second gate insulating film GI2 may on the first interlayer insulating film ILD1 which is on the gate electrode 111 disposed in the silicon transistor region AR1. In one or more embodiments, in the oxide transistor region AR2, the oxide semiconductor layer 135 is between the first interlayer insulating film ILD1 and the second gate insulating layer GI2, and in the silicon transistor region AR1, the first insulating layer ILD1 and the second gate insulating layer GI2 are between the second electrode 141 of the capacitor Cst and the first electrode of the capacitor Cst connected tro the first gate electrode 111.

As described above, the second gate insulating film GI2 may serve as a gate insulating film in a region which overlaps the oxide semiconductor layer 135 of the transistor disposed in the oxide transistor region AR2 and the second gate electrode 142 and the second gate insulating film GI2 may serve as the dielectric of the capacitor Cst in a region which overlaps the second electrode 141 of the capacitor Cst and the first electrode of the capacitor Cst. As described above, one insulating film (e.g., the second gate insulating film GI2) may be used as the gate insulating film of the transistor included in the oxide transistor region AR2 and as the dielectric of the capacitor Cst in another region (e.g., silicon transistor region AR1 as illustrated in FIG. 4), and thus the manufacturing or fabrication process may be simplified as compared with a process of separately forming individual insulating films. Furthermore, the number of insulating films included in the display device 1 is reduced, and thus a thickness of the display device 1 may be reduced.

The second conductive layer 140 is disposed on the second gate insulating film GI2. The second conductive layer 140 may include the second electrode 141 of the capacitor Cst disposed in the silicon transistor region AR1 and the second gate electrode 142 of the transistor disposed in the oxide transistor region AR2. The second conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and/or copper (Cu). The first conductive layer 110 may be a single film or a multilayer film.

The oxide semiconductor layer 135 of the transistor disposed in the oxide transistor region AR2 may be disposed above or at a layer above the first gate electrode 111 of the transistor disposed in the silicon transistor region AR1. In one or more embodiments, a portion of the first interlayer insulating film ILD1 is below the oxide semiconductor layer 135 of the transistor in the oxide transistor region AR2 and another portion of the first interlayer insulating film ILD1 is above the gate electrode 111 of the transistor in the silicon transistor region AR1. For example, the first interlayer insulating film ILD1 may be stacked on the first gate electrode 111, and the oxide semiconductor layer 135 may be disposed on the first interlayer insulating film ILD1.

The oxide semiconductor layer 135 of the transistor disposed in the oxide transistor region AR2 may be located below or at a layer below the second electrode 141 of the capacitor Cst disposed in the silicon transistor region AR1. In one or more embodiments, a portion of the second gate insulating film GI2 is above the oxide semiconductor layer 135 of the transistor in the oxide transistor region AR2 and another portion of the second gate insulating film GI2 is below second electrode 141 of the capacitor Cst in the silicon transistor region AR1. For example, the second gate insulating film GI2 may be disposed on the oxide semiconductor layer 135 (e.g., on an upper surface of the oxide semiconductor layer 135 and/or on a side surface of the oxide semiconductor layer 135) of the transistor disposed in the oxide transistor region AR2, and the second conductive layer 140 including the second electrode 141 of the capacitor Cst and the second gate electrode 142 of the transistor disposed in the oxide transistor region AR2 may be disposed on the second gate insulating film GI2.

The second electrode 141 of the capacitor Cst disposed in the silicon transistor region AR1 and the second gate electrode 142 of the transistor disposed in the oxide transistor region AR2, which form the second conductive layer 140, may be made of or include the same material. Further, the second electrode 141 of the capacitor Cst and the second gate electrode 142 may be formed to be coplanar (e.g., share a plane as illustrated in FIG. 4).

Specifically, both of the second electrode 141 of the capacitor Cst disposed in the silicon transistor region AR1 and the second gate electrode 142 of the transistor disposed in the oxide transistor region AR2 may be disposed on the same insulating film (e.g., the second gate insulating film GI2).

Further, the second electrode 141 of the capacitor Cst disposed in the silicon transistor region AR1 and the second gate electrode 142 of the transistor disposed in the oxide transistor region AR2 may be concurrently (e.g., simultaneously) formed using one mask. As described above, the second gate electrode 142 of the transistor disposed in the oxide transistor region AR2 is not formed by a separate mask process using a separate conductive layer and is formed concurrently (e.g., simultaneously) with the second electrode 141 of the capacitor Cst disposed in the silicon transistor region AR1 using the same mask, and thus the number of mask processes may be reduced.

The second interlayer insulating film ILD2 is disposed on the second conductive layer 140. The second interlayer insulating film ILD2 may include a silicon compound, a metal oxide, or the like. For example, the second interlayer insulating film ILD2 may include silicon oxide, silicon nitride, silicon oxynitride, aluminum oxide, tantalum oxide, hafnium oxide, zirconium oxide, titanium oxide, and/or the like. The above materials may be used alone or in combinations thereof.

A thickness of the second interlayer insulating film ILD2 may be greater than a thickness of each of the first gate insulating film GI1, the second gate insulating film GI2, and the first interlayer insulating film ILD1 which are described above. Further, the second interlayer insulating film ILD2 may be formed of the same material as the first interlayer insulating film ILD1, but the present disclosure is not limited thereto.

The third conductive layer 150 is disposed on the second interlayer insulating film ILD2. The third conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and/or copper (Cu).

The third conductive layer 150 may include a first source/drain electrode 151 and a second source/drain electrode 152 of the transistor disposed in the silicon transistor region AR1, and a first source/drain electrode 153 and a second source/drain electrode 154 of the transistor disposed in the oxide transistor region AR2.

In the transistor disposed in the silicon transistor region AR1, the first source/drain electrode 151 may be connected to the first source/drain region 105a of the silicon semiconductor layer 105 through a first contact hole CNT1 which passes through the second interlayer insulating film ILD2, the second gate insulating film GI2, the first interlayer insulating film ILD1, and the first gate insulating film Gil and exposes the first source/drain region 105a of the silicon semiconductor layer 105. The second source/drain electrode 152 may be connected to the second source/drain region 105b of the silicon semiconductor layer 105 through a second contact hole CNT2 which passes through the second interlayer insulating film ILD2, the second gate insulating film GI2, the first interlayer insulating film ILD1, and the first gate insulating film Gil and exposes the second source/drain region 105b of the silicon semiconductor layer 105.

In the transistor disposed in the oxide transistor region AR2, the first source/drain electrode 153 may be connected to the first source/drain region 135a of the oxide semiconductor layer 135 through a third contact hole CNT3 which passes through the second interlayer insulating film ILD2 and the second gate insulating film GI2 and exposes the first source/drain region 135a of the oxide semiconductor layer 135. The second source/drain electrode 154 may be connected to the second source/drain region 135b of the oxide semiconductor layer 135 through a fourth contact hole CNT4 which passes through the second interlayer insulating film ILD2 and the second gate insulating film GI2 and exposes the second source/drain region 135b of the oxide semiconductor layer 135.

The first via layer VIA1 is disposed on the third conductive layer 150. The first via layer VIA1 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), and/or the like.

The fourth conductive layer 160 is disposed on the first via layer VIA1. The fourth conductive layer 160 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), tungsten (W), and copper (Cu). The first conductive layer 110 may be a single film or a multilayer film.

The fourth conductive layer 160 may include a connection electrode 161 and an upper light-shielding pattern 163. A fifth contact hole CNT5 which exposes the second source/drain electrode 152 of the transistor disposed in the silicon transistor region AR1 may be disposed in the first via layer VIA1, and the connection electrode 161 may be connected to the second source/drain electrode 152 through the fifth contact hole CNT5.

The upper light-shielding pattern 163 may serve to prevent or substantially prevent light incident from an upper direction (e.g., a thickness direction) of the display panel 100 from entering the oxide semiconductor layer 135 located below the upper light-shielding pattern 163. The upper light-shielding pattern 163 may be disposed to overlap at least the channel region 135c of the oxide semiconductor layer 135. In one or more embodiments, the upper light-shielding pattern 163 may be disposed to overlap the entire oxide semiconductor layer 135 in a cross-sectional view as illustrated in FIG. 4.

The second via layer VIA2 is disposed on the connection electrode 161. The second via layer VIA2 may include an inorganic insulating material and/or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like.

The anode electrode ANO is disposed on the second via layer VIA2. The anode electrode ANO may be an anode electrode. The anode electrodes ANO may be disposed separately from each other for each pixel. The anode electrode ANO may be connected (e.g., electrically connected) to the connection electrode 161 through the sixth contact hole CNT6 which passes through the second via layer VIA2 and exposes a portion of the connection electrode 161.

The anode electrode ANO is not limited thereto and may have a stacked film structure in which a material layer having a high work function such as indium tin oxide (ITO), indium zinc oxide (IZO), zinc oxide (ZnO), or indium oxide (In$_2$O$_3$) and a reflective material layer, such as silver (Ag), magnesium (Mg), aluminum (Al), platinum (Pt), lead (Pb), gold (Au), nickel (Ni), neodium (Nd), iridium (Ir), chromium (Cr), or a mixture thereof are stacked. A layer having a high work function may be disposed above the reflective material layer and disposed close to a light-emitting layer EL. The anode electrode ANO may have a multilayer structure of ITO/Mg, ITO/MgF, ITO/Ag, and ITO/Ag/ITO, but the present disclosure is not limited thereto.

The pixel definition film PDL may be disposed on the anode electrode ANO. The pixel definition film PDL may include an opening which partially exposes the anode electrode ANO. The pixel definition film PDL may be made of an organic insulating material or an inorganic insulating material. For example, the pixel definition film PDL may include at least one of a polyimide resin, an acrylic resin, a silicone compound, a polyacrylic resin, and the like.

The light-emitting layer EL is disposed on the anode electrode ANO exposed by the pixel definition film PDL. The light-emitting layer EL may include an organic material layer. The organic material layer of the light-emitting layer may include an organic light-emitting layer and may further include a hole injection/transport layer and/or an electron injection/transport layer.

A cathode electrode CAT may be disposed on the light-emitting layer EL. The cathode electrode CAT may be a common electrode disposed over an entirety of pixels without distinguishing the pixels PX. Each of the anode electrode ANO, the light-emitting layer EL, and the cathode electrode CAT may form an organic light-emitting element.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba, a compound thereof, or a mixture (e.g., a mixture of Ag and Mg, etc.) thereof. The cathode electrode CAT may further include a transparent metal oxide layer disposed on the material layer having the low work function.

The anode electrode ANO, the light-emitting layer EL, and the cathode electrode CAT may constitute an organic light-emitting element.

A thin film encapsulation layer 170 including a first inorganic film 171, a first organic film 172, and a second inorganic film 173 is disposed above the cathode electrode CAT. The first inorganic film 171 and the second inorganic film 173 may be in contact with each other at an end portion of the thin film encapsulation layer 170. The first organic film 172 may be sealed by the first inorganic film 171 and the second inorganic film 173.

Each of the first inorganic film 171 and the second inorganic film 173 may include silicon nitride, silicon oxide, silicon oxynitride, and/or the like. The first organic film 172 may include an organic insulating material.

Hereinafter, a non-display region NDA will be described.

In the non-display region NDA of the display panel 100, the base substrate 101, the barrier layer 102, the buffer layer 103, the first gate insulating film GI1, the first interlayer insulating film ILD1, the second gate insulating film GI2, the second interlayer insulating film ILD2, the first via layer VIA1, the fourth conductive layer 160, the second via layer VIA2, and the pixel definition film PDL may be sequentially disposed or stacked.

The non-display region NDA may include a bending region BA and a bending opening OP1.

In the non-display region NDA, the bending region BA may be a region in which the barrier layer 102, the buffer layer 103, the first gate insulating film GI1, the first interlayer insulating layer ILD1, the second gate insulating film GI2, and the second interlayer insulating layer ILD2 are not disposed and in which the upper surface of the base substrate 101 is exposed. In one or more embodiments, side portions of the barrier layer 102, the buffer layer 103, the first gate insulating film GI1, the first interlayer insulating layer ILD1, the second gate insulating film GI2, and/or the second interlayer insulating layer ILD2 define a bending opening OP1 that exposes an upper surface of the base substrate 101 in the bending region BA. In one or more embodiments, the bending opening OP1 may be tapered and/or stepped as illustrated in FIG. 4.

In the non-display region NDA, the bending opening OP1 may pass though the barrier layer 102, the buffer layer 103, the first gate insulating film GI1, the first interlayer insulating layer ILD1, the second gate insulating film GI2, and/or the second interlayer insulating layer ILD2 and expose a portion of the base substrate 101. In the bending opening OP1, side surfaces of the barrier layer 102, the buffer layer 103, the first gate insulating film GI1, the first interlayer insulating layer ILD1, the second gate insulating film GI2, and the second interlayer insulating layer ILD2 may be exposed. The exposed side surfaces of the barrier layer 102, the buffer layer 103, the first gate insulating film GI1, the first interlayer insulating layer ILD1, the second gate insulating film GI2, and the second interlayer insulating layer ILD2 may be arranged with each other, but the present disclosure is not limited thereto.

The bending opening OP1 may be formed by a process operation of forming the first contact hole CNT1 to the fourth contact hole CNT4 which will be described in more detail below. Due to the formation of the bending opening OP1, bending stress that may occur when the above-described display device 1 is bent in the bending region BA may be prevented or reduced.

The bending opening OP1 may be filled with the first via layer VIA1. The first via layer VIA1 may be disposed on the second interlayer insulating film ILD2 in the non-display region NDA and may be disposed on the exposed side surfaces of the barrier layer 102, the buffer layer 103, the first gate insulating film GI1, the first interlayer insulating layer ILD1, the second gate insulating film GI2, and the second interlayer insulating layer ILD2 in the bending region BA. The first via layer VIA1 may be in contact (e.g., direct contact) with the exposed upper surface of the base substrate 101.

In the non-display region NDA and the bending region BA, a connection line 165 may be disposed on the first via layer VIA1. The connection line 165 may be formed of the fourth conductive layer 160. The connection line 165 may be formed concurrently (e.g., simultaneously) with the connection electrode 161 and/or the upper light-shielding pattern 163 which are described above and may be made of the same material as the material forming the connection electrode 161 and/or the upper light-shielding pattern 163.

The second via layer VIA2 and the pixel definition film PDL may be disposed on the connection line 165 as illustrated in FIG. 4. However, in one or more embodiments, in the non-display region NDA, at least one of the second via layer VIA2 and the pixel definition film PDL may be omitted.

Hereinafter, a method of manufacturing a display device according to an embodiment will be described.

Figure 5:
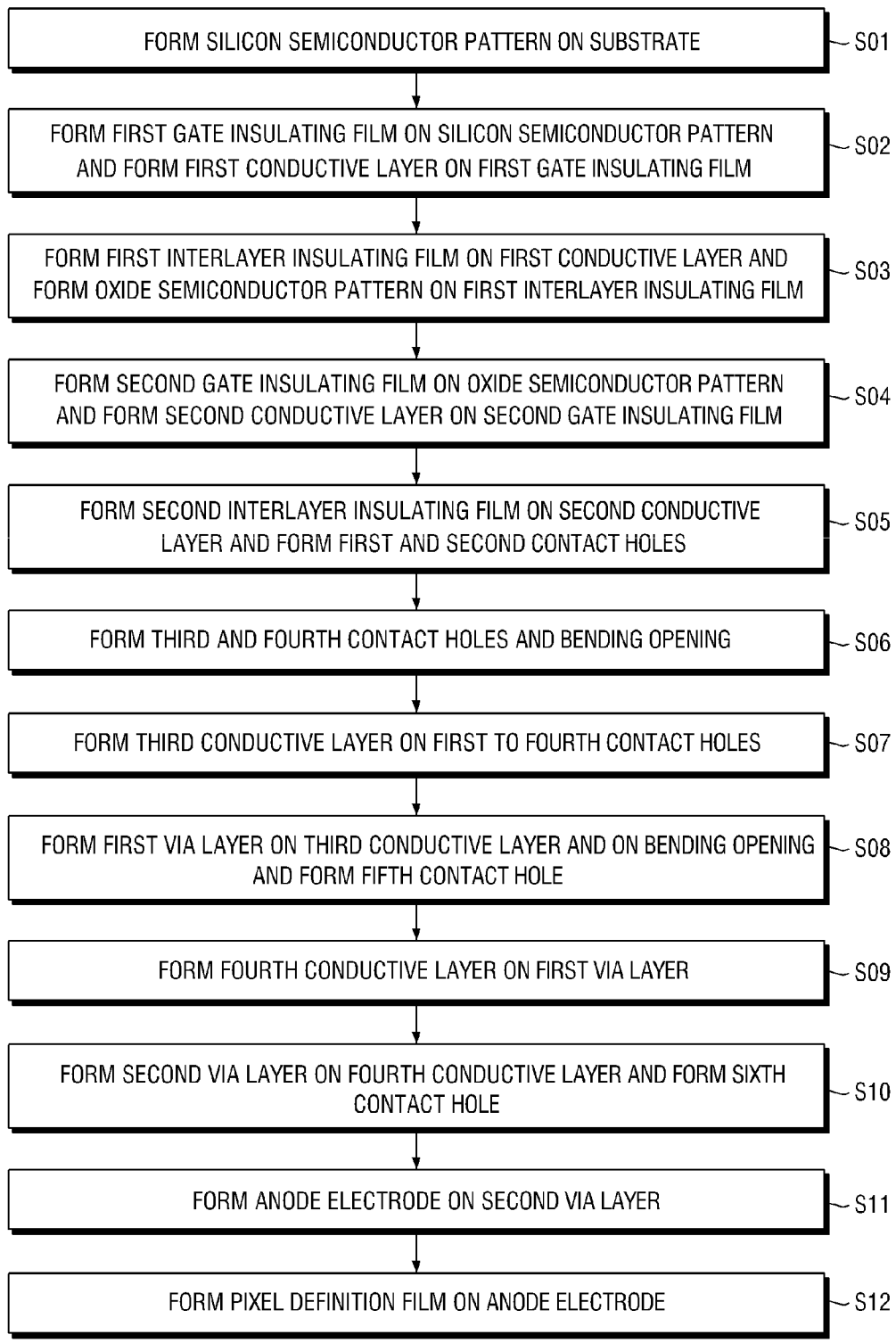
FIG. 5 is a flowchart illustrating a method of manufacturing a display device according to an embodiment.

FIG. 5 is a flowchart illustrating a method of manufacturing a display device according to an embodiment, and FIGS. 6-17 are cross-sectional views illustrating process operations of a method of manufacturing a display device according to one or more embodiments.

Figure 6:
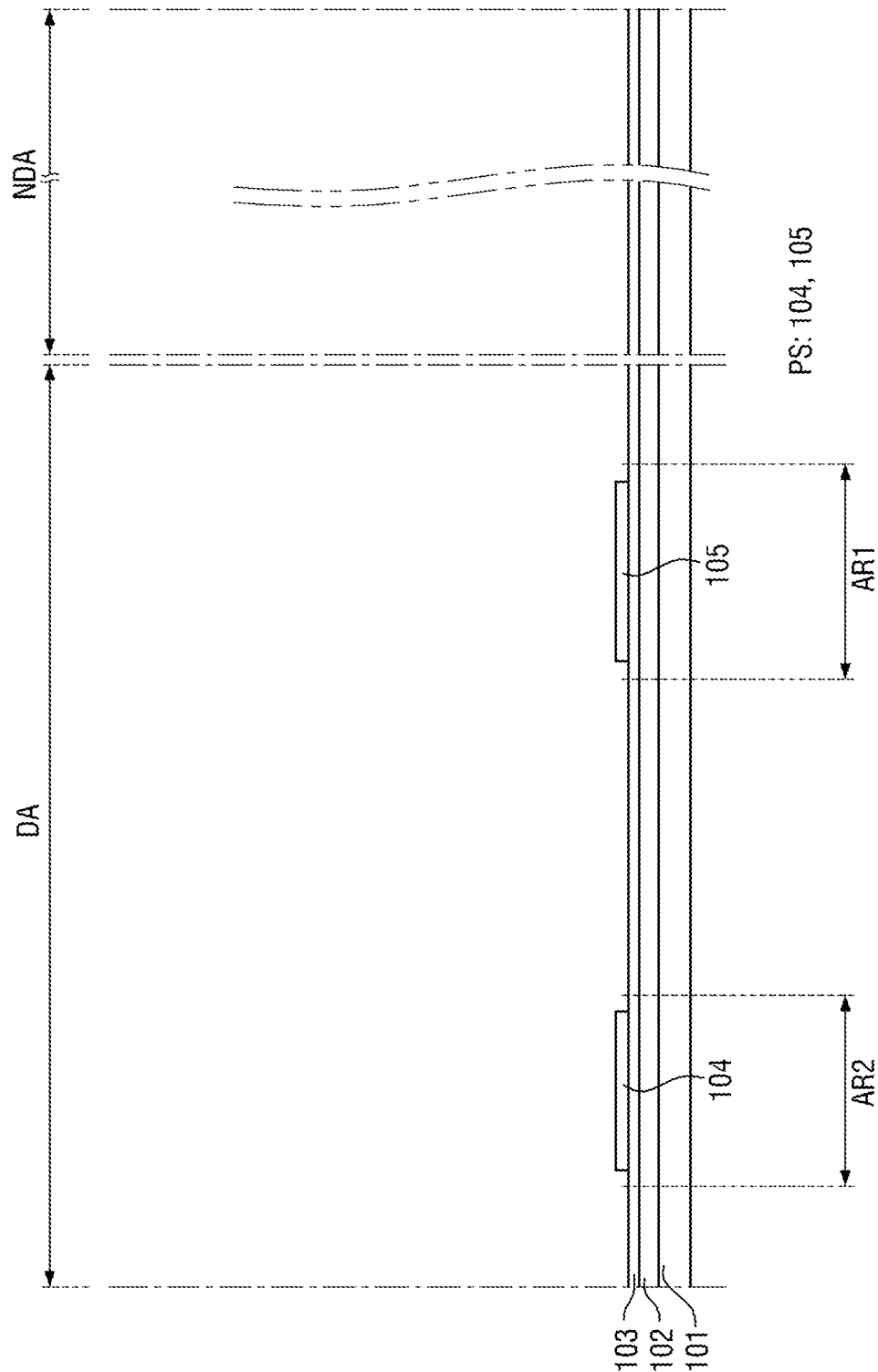
FIGS. 6-17 are cross-sectional views illustrating process operations of a method of manufacturing a display device according to an embodiment.

Referring to FIGS. 5 and 6, a base substrate 101 is provided in which, a display region DA (including a silicon transistor region AR1 and an oxide transistor region AR2) and a non-display region NDA disposed around the display region DA are defined and on which a silicon semiconductor pattern PS including a silicon semiconductor layer 105 disposed in the silicon transistor region AR1 and a silicon lower light-shielding pattern 104 disposed in the oxide transistor region AR2 is disposed (S01).

In one or more embodiments, a barrier layer 102 and a buffer layer 103 are sequentially stacked on the base substrate 101, and the silicon semiconductor layer 105 and the silicon lower light-shielding pattern 104 are concurrently (e.g., simultaneously) formed on the buffer layer 103. A patterned silicon semiconductor layer 105 and a patterned silicon lower light-shielding pattern 104 may be formed by one mask process (e.g., the same mask). That is, a material for a silicon semiconductor layer may be deposited on an entire surface of the buffer layer 103 and then patterned by a photolithography process so that the silicon semiconductor pattern PS including the silicon semiconductor layer 105 and the silicon lower light-shielding pattern 104 may be formed (e.g., concurrently formed) as illustrated in FIG. 6.

Figure 7:
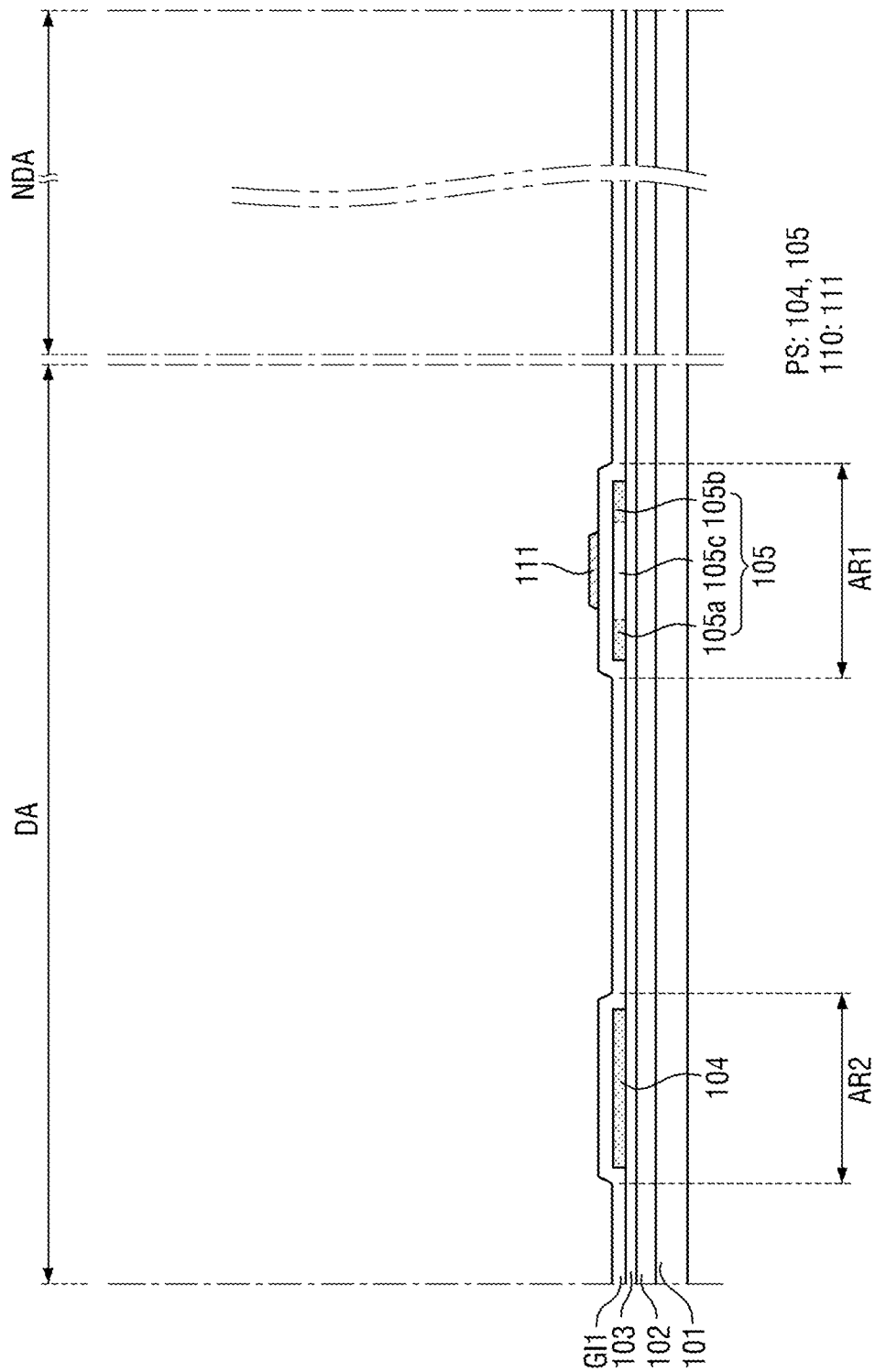

Subsequently, referring to FIG. 7, a first gate insulating film GI1 is formed on the silicon semiconductor pattern PS and a first conductive layer 110 including a first gate electrode 111 is formed on the first gate insulating film GI1 (S02).

In one or more embodiments, the first gate insulating film GI1 is formed on the entire surface (e.g., the entire exposed surface) of the buffer layer 103 on which the silicon semiconductor layer 105 is formed. Subsequently, the first gate electrode 111 is formed on the first gate insulating film GI1. That is, a material layer for a first conductive layer may be deposited on an entire surface of the first gate insulating film GI1 and patterned by a photolithography process so that the first gate electrode 111 may be formed as illustrated in FIG. 7.

Figure 8:
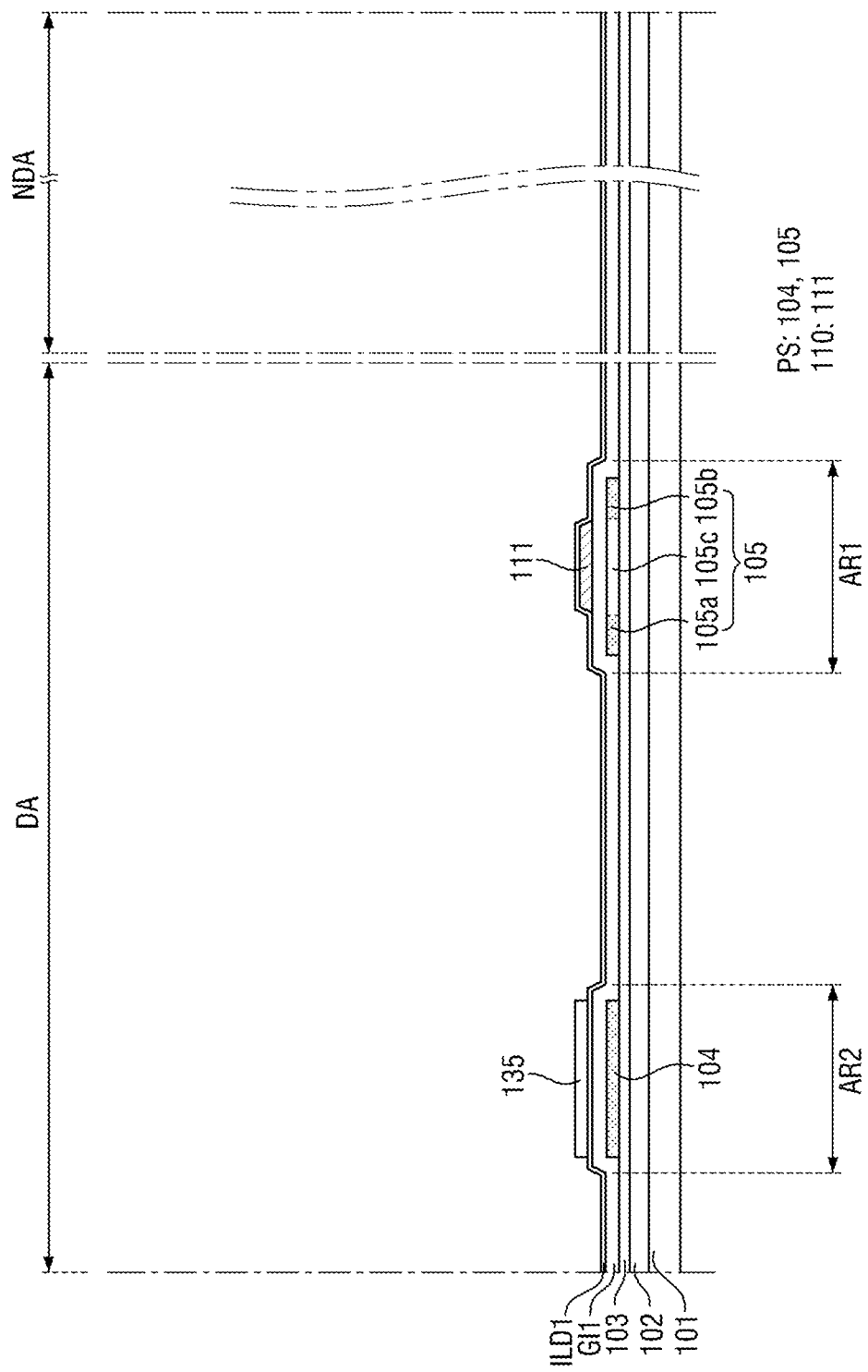

Subsequently, referring to FIG. 8, a first interlayer insulating film ILD1 is formed on the first gate electrode 111 and an oxide semiconductor layer 135 is formed on the first interlayer insulating film ILD1 (S03).

In one or more embodiments, the first interlayer insulating film ILD1 is formed on an entire surface (e.g., the entire exposed surface) of the first gate insulating film GI1 on which the first gate electrode 111 is formed. Subsequently, the oxide semiconductor layer 135 is formed on the first interlayer insulating film ILD1. The oxide semiconductor layer 135 may be formed by a mask process. For example, a material for an oxide semiconductor layer may be deposited on an entire surface of the first interlayer insulating film ILD1 and then patterned by a photolithography process so that the oxide semiconductor layer 135 may be formed as illustrated in FIG. 8.

Figure 9:
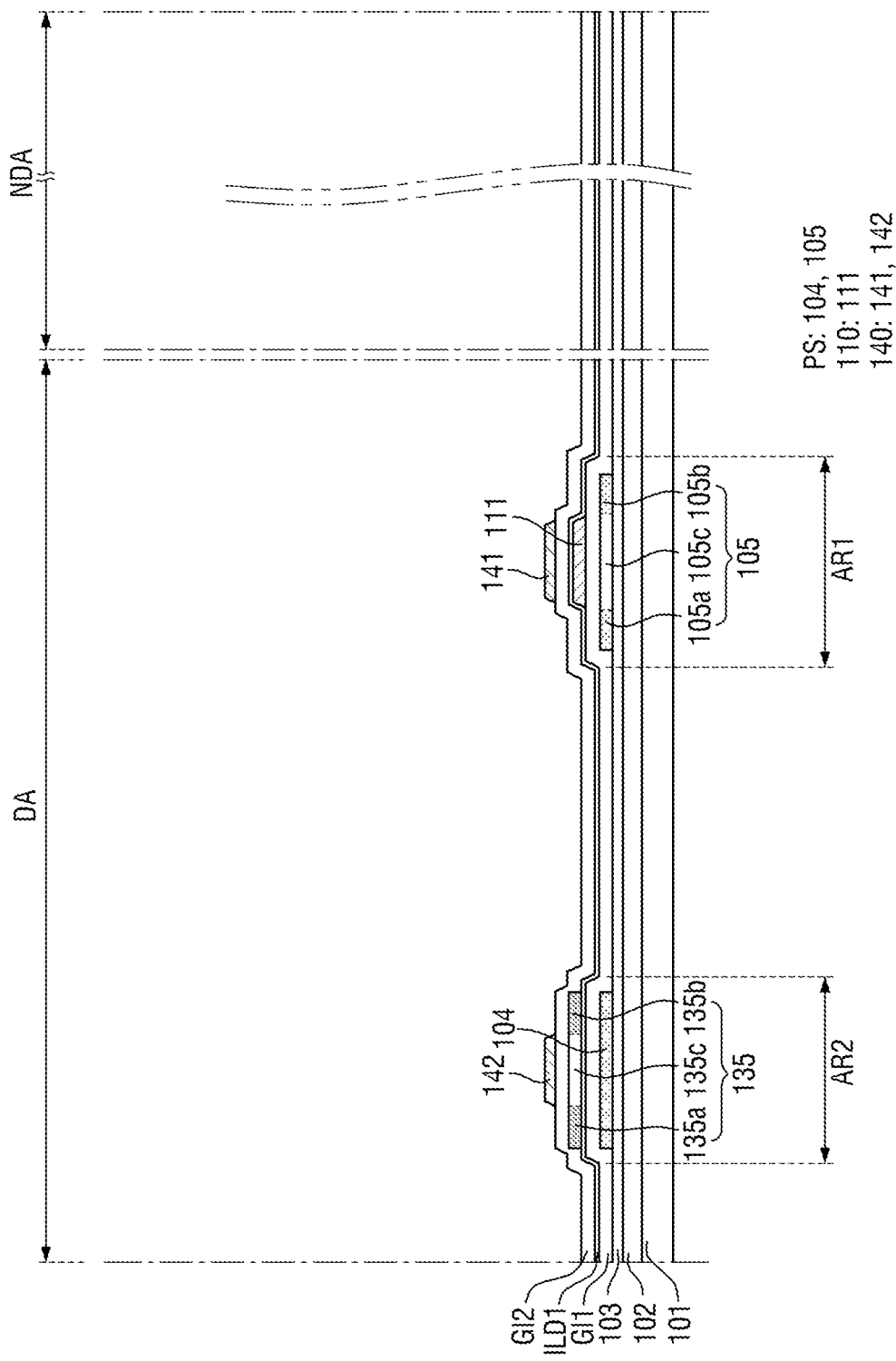

Subsequently, referring to FIG. 9, a second gate insulating film GI2 is formed on the oxide semiconductor layer 135, and a second conductive layer 140 including a second electrode 141 of a capacitor Cst and a second gate electrode 142 is formed on the second gate insulating film GI2 (S04).

In one or more embodiments, the second gate insulating film GI2 is deposited on the entire surface (e.g., the entire exposed surface) of the first interlayer insulating film ILD1 on which the oxide semiconductor layer 135 is disposed, and a patterned second electrode 141 of the capacitor Cst and a patterned second gate electrode 142 are concurrently (e.g., simultaneously) formed on the second gate insulating film GI2. The patterned second electrode 141 of the capacitor Cst and the patterned second gate electrode 142 may be formed by one mask process (e.g., the same mask). That is, a material for a second conductive layer may be deposited on an entire surface of the second gate insulating film GI2 and patterned by a photolithography process so that the second conductive layer 140 including the second electrode 141 of the capacitor Cst and the second gate electrode 142 may be formed as illustrated in FIG. 9.

Figure 10:
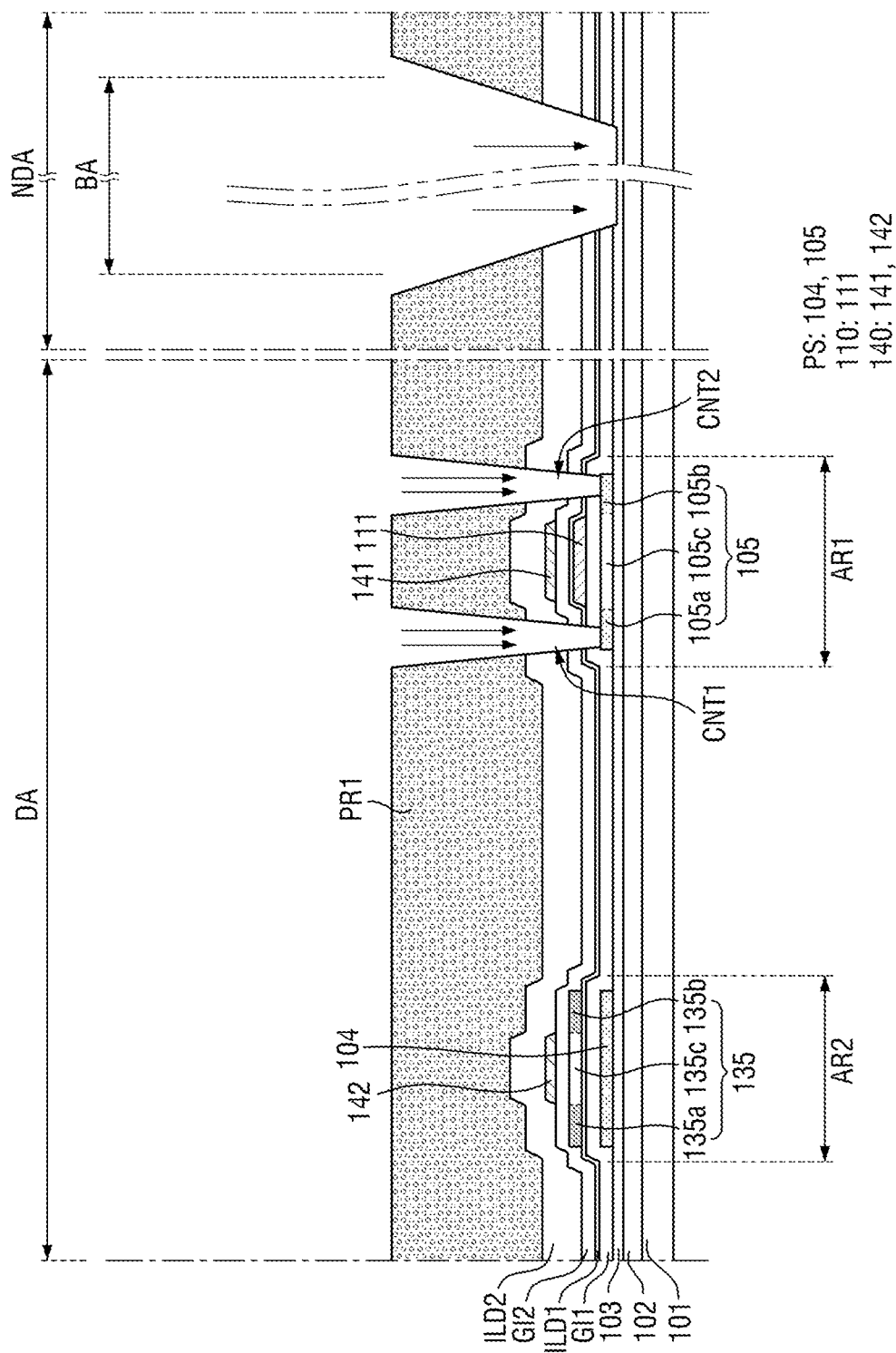

Subsequently, referring to FIG. 10, a second interlayer insulating layer ILD2 is stacked on the second conductive layer 140 including the second electrode 141 of the capacitor Cst and the second gate electrode 142, and a first contact hole CNT1 and a second contact hole CNT2 which expose a portion of the silicon semiconductor layer 105 are formed in the display region DA (S05).

The contact holes CNT1 and CNT2 may be formed by one mask process (e.g., the same mask). The first contact hole CNT1 and the second contact hole CNT2 may be concurrently (e.g., simultaneously) formed using the same mask. For example, an insulating layer for a second interlayer insulating film is deposited on the entire surface of the first interlayer insulating film ILD1 on which the oxide semiconductor layer 135, the second gate insulating film GI2, and the second gate electrode 142 are formed. Subsequently, a first photoresist pattern PR1 which exposes a portion of the silicon semiconductor layer 105 is formed on the insulating layer for the second interlayer insulating film, and the insulating layer for the second interlayer insulating film, the first interlayer insulating film ILD1, and the first gate insulating film Gil are etched using the first photoresist pattern PR1 as an etching mask so that the first contact hole CNT1 and the second contact hole CNT2 which expose the portion of the silicon semiconductor layer 105 are formed.

In addition, in the non-display region NDA, the bending opening OP1 may be formed by the operation S05 of forming the first contact hole CNT1 and the second contact hole CNT2 and the operation S06 of forming a third contact hole CNT3 and a fourth contact hole CNT4, which will be described in more detail below, without any additional process, and a portion of the bending opening OP1 may be formed by the operation S05 of forming the first contact hole CNT1 and the second contact hole CNT2.

Specifically, the first photoresist pattern PR1 may be formed to expose the portion (e.g., the upper surface) of the silicon semiconductor layer 105 and the bending opening OP1 of the bending region BA. When etching is performed using the first photoresist pattern PR1, the second interlayer insulating film ILD2, the first interlayer insulating film ILD1, and the first gate insulating film Gil in the bending region BA may be concurrently (e.g., simultaneously) etched in the operation S05 of forming the first contact hole CNT1 and the second contact hole CNT2, and thus a portion of the buffer layer 103 in the corresponding region may be exposed. In the operation S05, the first contact hole CNT1 and the second contact hole CNT2 are etched to expose the portion of the silicon semiconductor layer 105, and thus the silicon semiconductor layer 105 may also be partially etched or damaged during the etching process. In order to minimize or reduce damage to the silicon semiconductor layer 105, the operation S05 may be performed so as to etch only the second interlayer insulating film ILD2, the first interlayer insulating film ILD1, and the first gate insulating film Gil in the bending region BA. Therefore, in the operation S05, the buffer layer 103 in the non-display region NDA may remain without being removed. The bending opening OP1 which exposes a surface of the base substrate 101 may be formed (e.g., completely formed) by the operation S06 of forming the third contact hole CNT3, the fourth contact hole CNT4, and the bending opening OP1, which will be described in more detail below.

Figure 11:
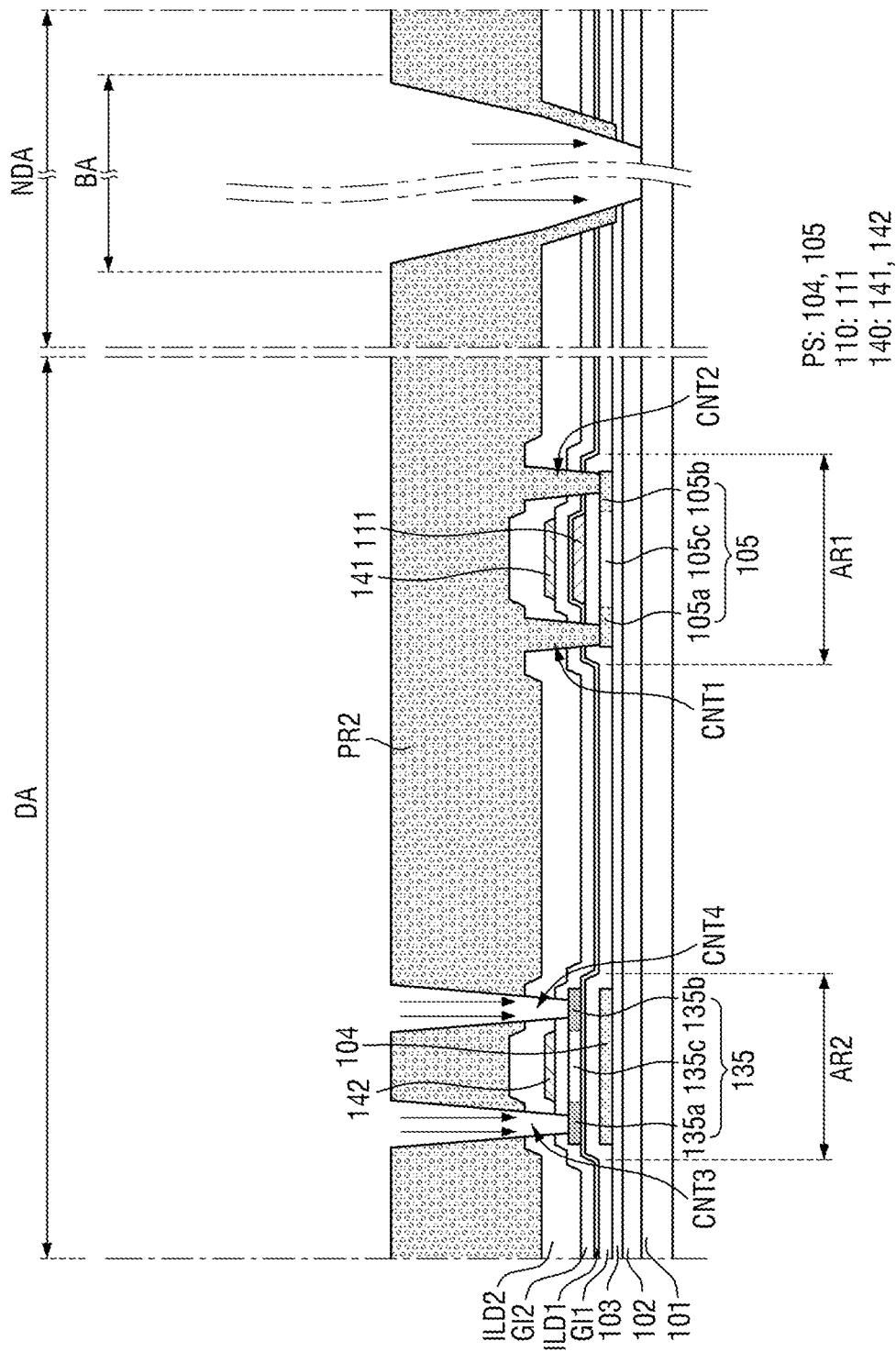

Subsequently, referring to FIG. 11, the third contact hole CNT3 and the fourth contact hole CNT4 which expose a portion of the oxide semiconductor layer 135 are formed (S06).

The contact holes CNT3 and CNT4 may be formed by a mask process. The third contact hole CNT3 and the fourth contact hole CNT4 may be concurrently (e.g., simultaneously) formed using the same mask. For example, a second photoresist pattern PR2 which exposes the portion of the oxide semiconductor layer 135 is formed on the second interlayer insulating film ILD2 in which the first contact hole CNT1 and the second contact hole CNT2 are formed, and the second interlayer insulating film ILD2 is etched using the second photoresist pattern PR2 as an etching mask so that the third contact hole CNT3 and the fourth contact hole CNT4 which expose the portion of the oxide semiconductor layer 135 are formed.

In addition, the process operation of forming the bending opening OP1 in the non-display region NDA may be completed by the operation S06. The buffer layer 103 and the barrier layer 102 which are not etched in the operation S05 of forming the first contact hole CNT1 and the second contact hole CNT2 may be etched in the operation S06, and accordingly, the process operation of forming the bending opening OP1 which exposes a portion (e.g., the upper surface) of the base substrate 101 may be completed.

Specifically, a thickness of each of the buffer layer 103 and the barrier layer 102 may be similar to a thickness of each of the second interlayer insulating film ILD2 and the second gate insulating film GI2. That is, when the buffer layer 103 and the barrier layer 102 are etched, the method of etching the above components may be substantially the same as the method of etching the second interlayer insulating film ILD2 and the second gate insulating film GI2, and a separate process may be unnecessary. Therefore, the buffer layer 103 and the barrier layer 102 may be etched by the operation S06 so that the process operation of forming the bending opening OP1 may be completed.

Figure 12:
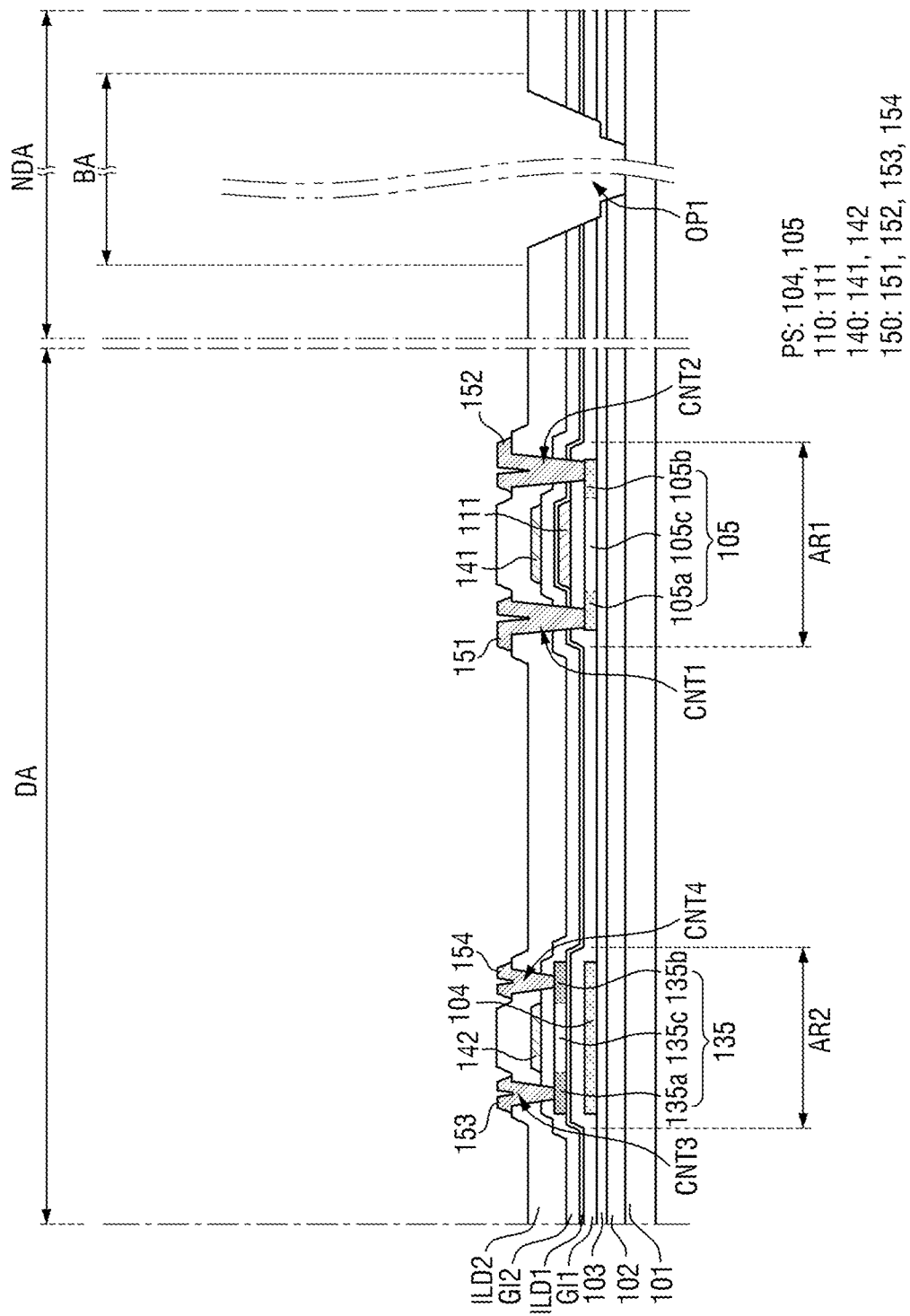

Subsequently, referring to FIG. 12, a patterned third conductive layer 150 is formed on the second interlayer insulating film ILD2 (S07). The patterned third conductive layer 150 may be formed by a mask process. For example, a material layer for a third conductive layer is deposited on an entire surface of the second interlayer insulating film ILD2. In the deposition process, the material layer for the third conductive layer may be deposited on inner sides of the first to fourth contact holes CNT1, CNT2, CNT3, and CNT4. Therefore, first and second source/drain electrodes 151 and 152 of the transistor disposed in the silicon transistor region AR1, and first and second source/drain electrodes 153 and 154 of the transistor disposed in the oxide transistor region AR2 may be respectively connected to the silicon semiconductor layer 105 and the oxide semiconductor layer 135. Subsequently, a photoresist layer is deposited on the material layer for the third conductive layer, a photoresist pattern is formed by exposure and development, and then the material layer for the third conductive layer is etched using the photoresist pattern as an etching mask. Thereafter, the photoresist pattern is removed by a stripping or ashing process and thus the patterned third conductive layer 150 is completely formed as illustrated in FIG. 12.

Figure 13:
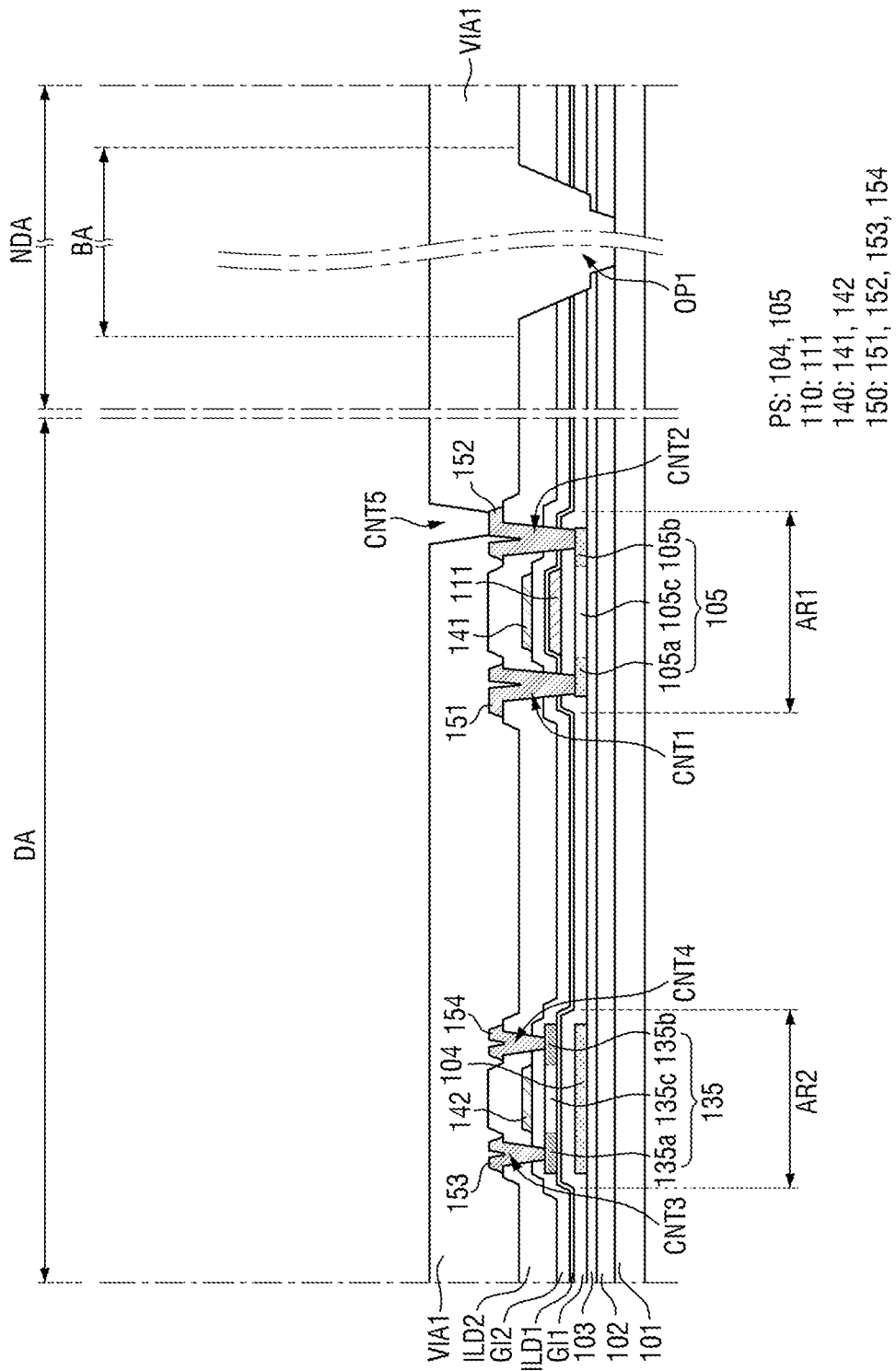

Subsequently, referring to FIG. 13, a first via layer VIA1 is formed on the third conductive layer 150 and a fifth contact hole CNT5 is formed which exposes portions of the first and second source/drain electrodes 151 and 152 of the transistor disposed in the silicon transistor region AR1 (S08).

The first via layer VIA1 may include, for example, an organic material including a photosensitive material. The first via layer VIA1 may be stacked over the display region DA and the non-display region NDA and may have a roughly flat surface. In this case, the bending opening OP1 of the bending region BA of the non-display region NDA may also be filled with the first via layer VIA1. After an organic material layer for a via layer is deposited, the fifth contact hole CNT5 which exposes the portions of the first and second source/drain electrodes 151 and 152 of the transistor disposed in the silicon transistor region AR1 may be formed in the first via layer VIA1 by exposure and development.

Figure 14:
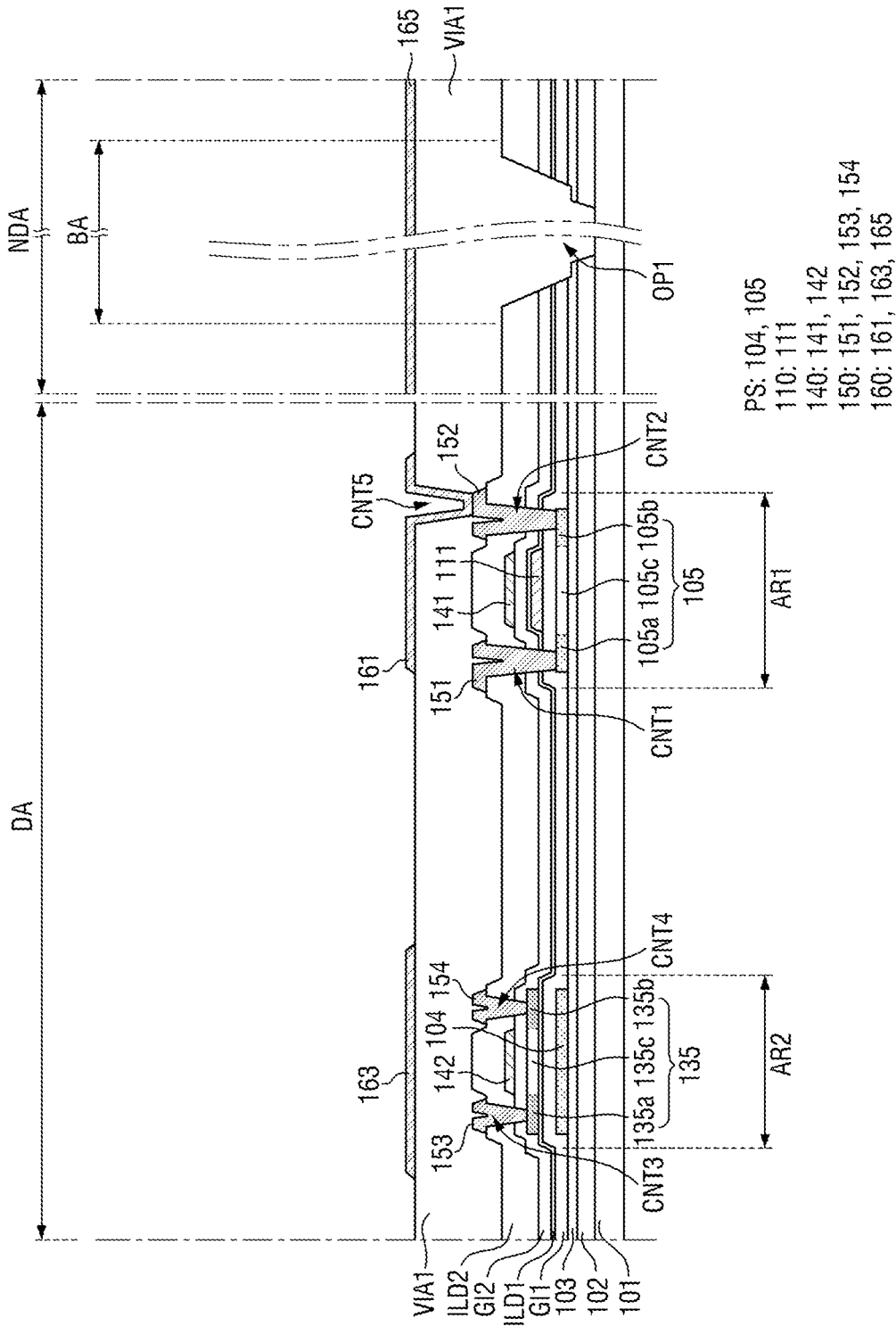

Subsequently, referring to FIG. 14, a fourth conductive layer 160 is formed on the first via layer VIA1 (S09).

The fourth conductive layer 160 may include a connection electrode 161 disposed in the display region DA, an upper light-shielding pattern 163, and a connection line 165 disposed in the non-display region NDA. A patterned fourth conductive layer 160 may be formed by a mask process. For example, a material layer for a fourth conductive layer is deposited on an entire surface of the first via layer VIA1. In the deposition process, the material layer for the fourth conductive layer may be deposited on an inner side of the fifth contact hole CNT5. In one or more embodiments, the connection electrode 161 may be formed such that the connection electrode 161 contacts the second source/drain electrode 152. Therefore, the connection electrode 161 may be connected (e.g., electrically connected) to the first and second source/drain electrodes 151 and 152 of the transistor disposed in the silicon transistor region AR1. Subsequently, a photoresist layer is deposited on the material layer for the fourth conductive layer, a photoresist pattern is formed by exposure and development, and then the material layer for the fourth conductive layer is etched using the photoresist pattern as an etching mask. Thereafter, the photoresist pattern is removed by a stripping or ashing process, and thus the patterned fourth conductive layer 160 is formed (e.g., completely formed) as illustrated in FIG. 14.

Figure 15:
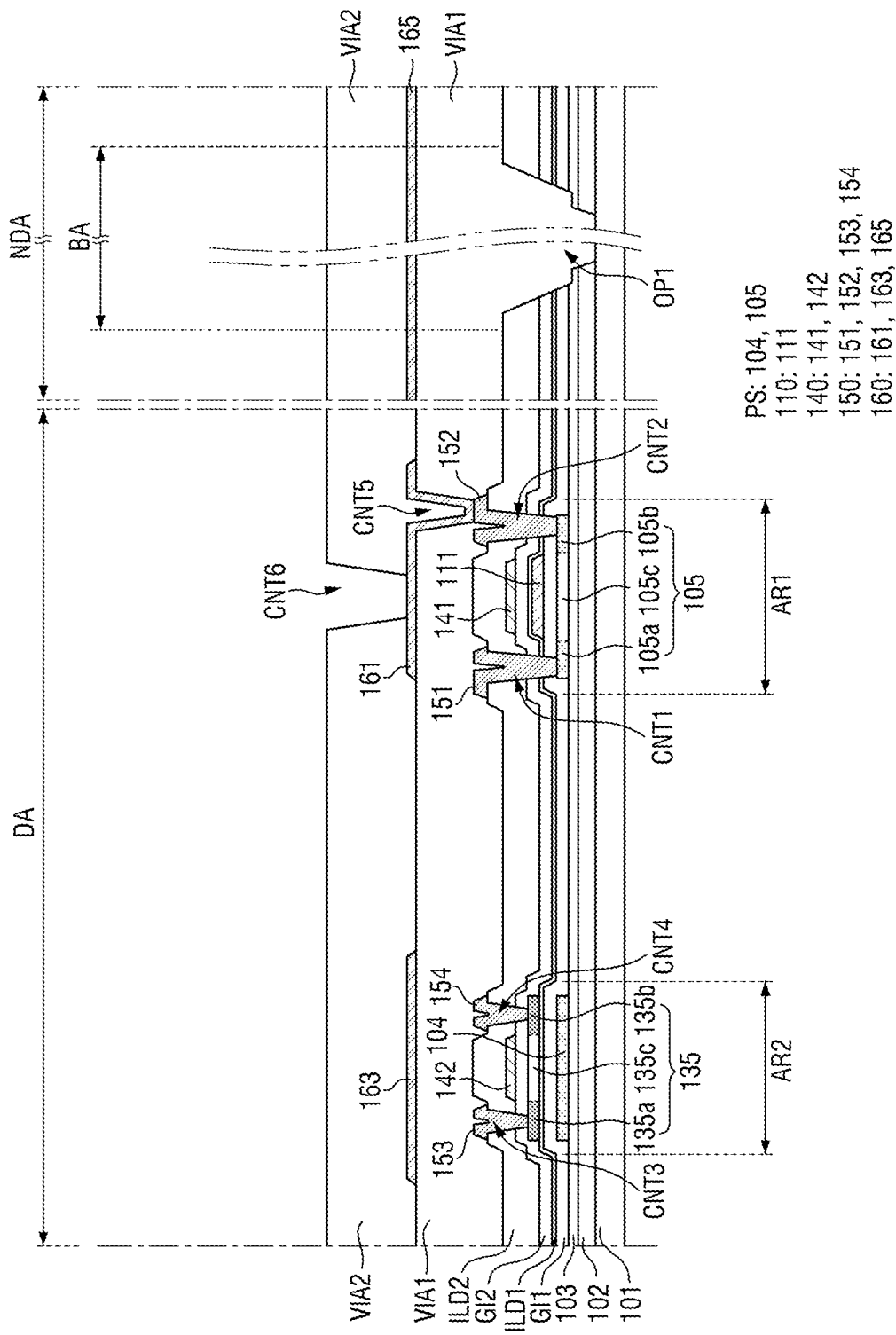

Subsequently, referring to FIG. 15, a second via layer VIA2 is formed on the fourth conductive layer 160, and a sixth contact hole CNT6 which exposes a portion of the connection electrode 161 is formed (S10).

The second via layer VIA2 may include, for example, an organic material including a photosensitive material. The second via layer VIA2 may be stacked only in the display region DA and may have a roughly or substantially flat surface. After an organic material layer for a via layer is deposited, the sixth contact hole CNT6 which exposes the portion of the connection electrode 161 may be formed in the second via layer VIA2 by exposure and development.

Figure 16:
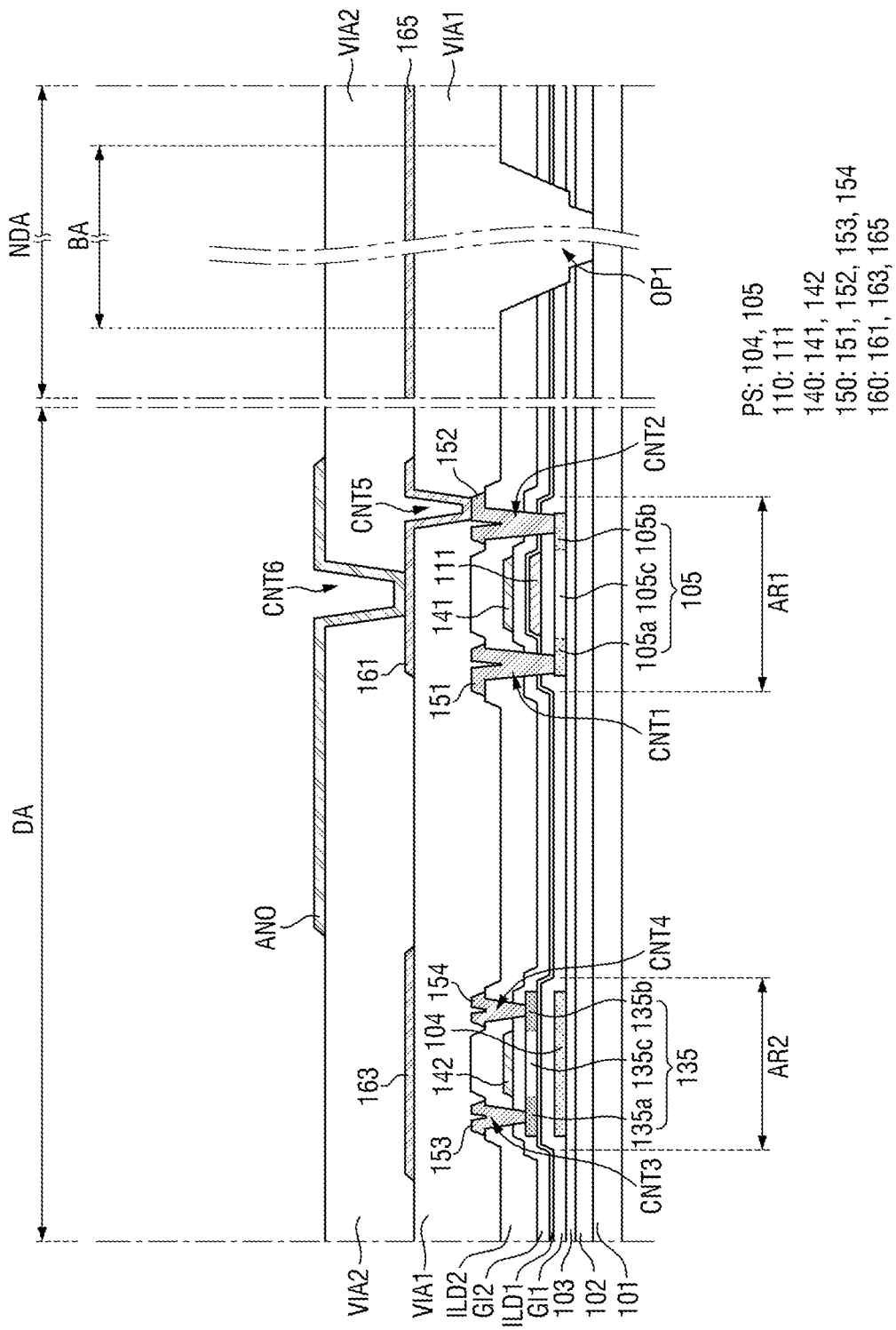

Subsequently, referring to FIG. 16, an anode electrode ANO is formed on the second via layer VIA2 (S11).

A patterned anode electrode ANO may be formed by a mask process. Specifically, a material layer for an anode electrode is deposited on an entire surface of the second via layer VIA2. In the deposition process, the material layer for the anode electrode may be deposited on an inner side of the sixth contact hole CNT6 and be connected (e.g., electrically connected) to the connection electrode 161.

Figure 17:
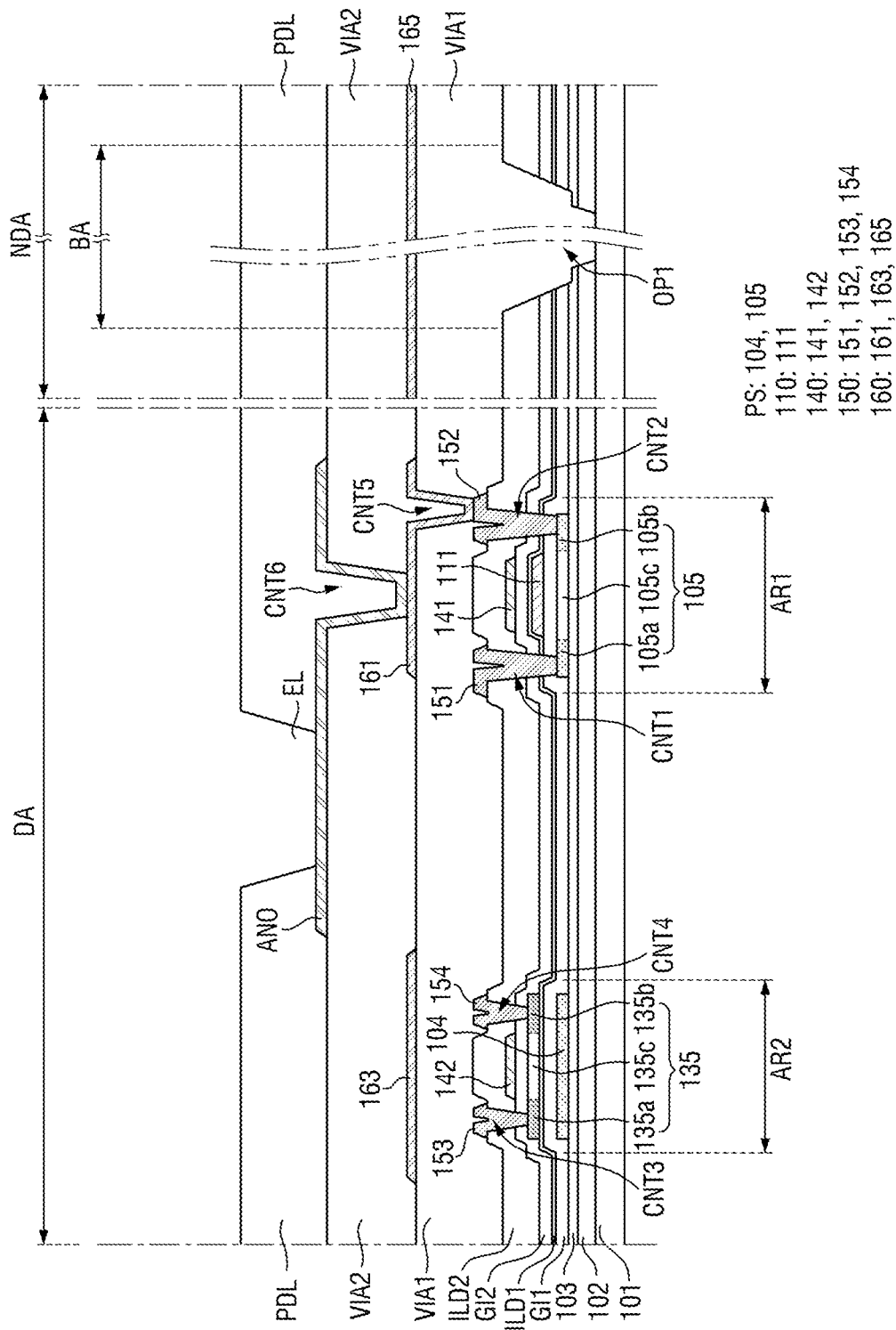

Subsequently, referring to FIG. 17, a patterned pixel definition film PDL is formed on the second via layer VIA2 in which the anode electrode ANO is formed (S12).

The pixel definition film PDL may include, for example, an organic material including a photosensitive material. In this case, the patterned pixel definition film PDL may be formed by applying an organic material layer for a bank layer and then performing exposure and development.

The pixel definition film PDL may be formed along a boundary of the pixel PX and may partially overlap the anode electrode ANO. The pixel definition film PDL may be formed to overlap the sixth contact hole CNT6. When an inner space of the sixth contact hole CNT6 is not fully filled with the anode electrode ANO and is only partially filled therewith (e.g., the anode electrode ANO formed on the surface of the second via layer VIA2 defines a gap), the inner space (e.g., the gap) of the sixth contact hole CNT6 may be fully filled with the pixel definition film PDL.

As described above, according to the illustrated embodiment, the second electrode 141 of the capacitor Cst disposed in the silicon transistor region AR1 and the second gate electrode 142 of the transistor disposed in the oxide transistor region AR2 may be formed using one mask. That is, when the second electrode 141 of the capacitor Cst and the second gate electrode 142 are formed, two mask processes are not required and only one mask process may be used in order to form the two components. Therefore, the number of mask processes may be reduced, and thus, process efficiency may be improved.

Hereinafter, additional embodiments will be described. In the following embodiments, the same configuration as the above-described embodiment will be omitted or simplified, and differences between the following embodiments and the above-described embodiment will be described.

Figure 18:
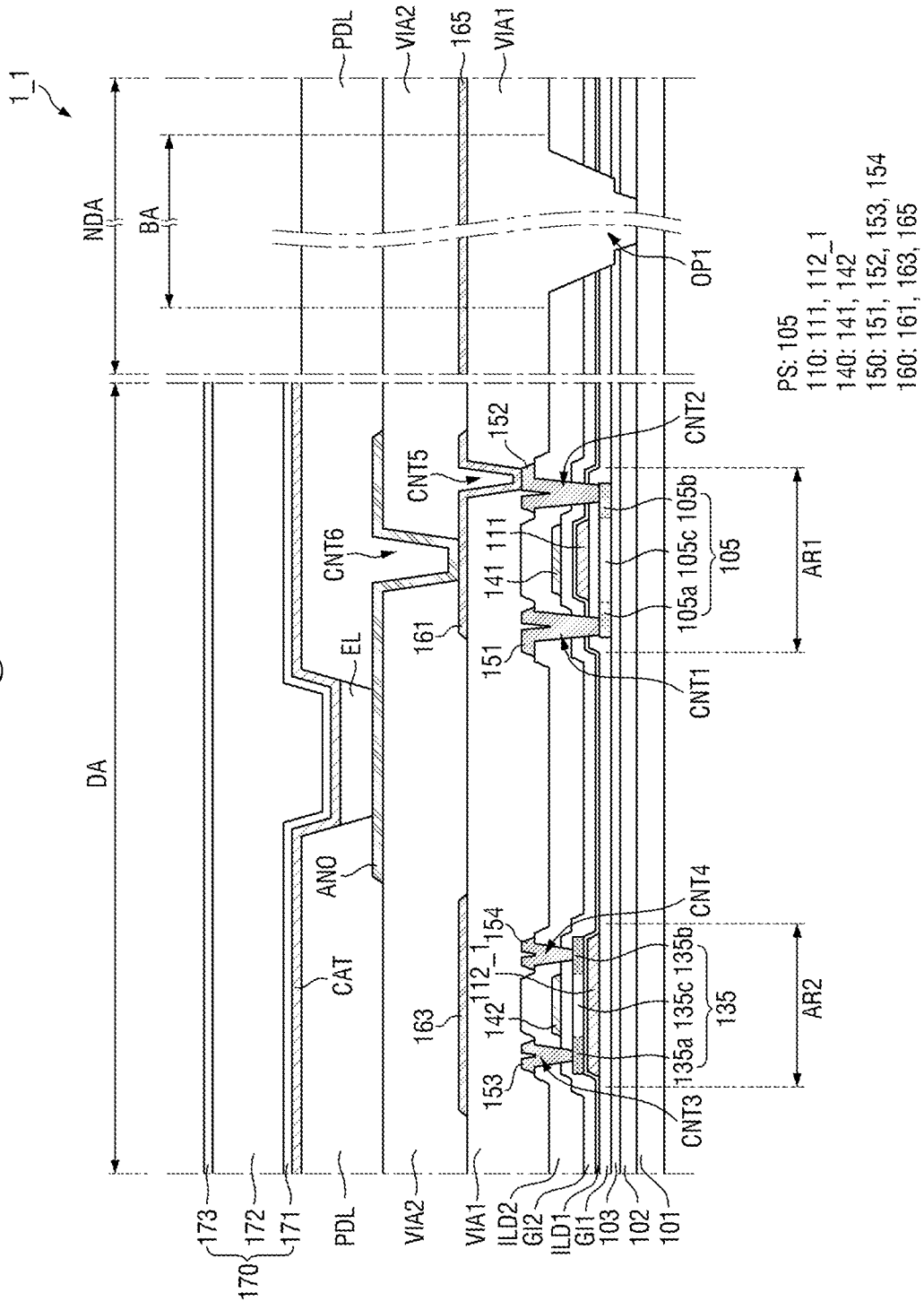
FIG. 18 is a cross-sectional view of a display device according to another embodiment.

FIG. 18 is a cross-sectional view of a display device according to another embodiment.

Referring to FIG. 18, a display device 1_1 according to the illustrated embodiment is different from the display device in the embodiment of FIG. 4 in that a metal lower light-shielding pattern 112_1 is disposed on a first gate insulating film GI1 and forms a first conductive layer 110.

The metal lower light-shielding pattern 112_1 in the illustrated embodiment may be disposed in an oxide transistor region AR2. Unlike the silicon lower light-shielding pattern 104 in the embodiment of FIG. 4, the metal lower light-shielding pattern 112_1 may form the first conductive layer 110 and may be formed to be coplanar with a first gate electrode 111 of a transistor disposed in a silicon transistor region AR1.

In other words, the first conductive layer 110 in the illustrated embodiment may include the metal lower light-shielding pattern 112_1 as well as the first gate electrode 111. The metal lower light-shielding pattern 112_1 together with the first gate electrode 111 may be disposed on the first gate insulating film GI1 (e.g., at two different portions of the first gate insulating film GI1). Further, the metal lower light-shielding pattern 112_1 may be formed together with the first gate electrode 111 using one mask in the operation S02 of forming the first conductive layer 110. Therefore, a separate process is not required to form the metal lower light-shielding pattern 112_1, and thus, the number of masks used to form the metal lower light-shielding pattern 112_1 and the first gate electrode 111 may be reduced compared to other mask processes.

Furthermore, in the illustrated embodiment, the metal lower light-shielding pattern 112_1 may be used as another gate electrode of the transistor disposed in the oxide transistor region AR2. In this case, because the metal lower light-shielding pattern 112_1 faces the oxide semiconductor layer 135 with only the first interlayer insulating film ILD1 interposed therebetween, the metal lower light-shielding pattern 112_1 may be located closer to the oxide semiconductor layer 135. Therefore, the metal lower light-shielding pattern 112_1 may operate more smoothly as a gate electrode.

In addition, a second gate electrode 142 and a second electrode 141 of a capacitor Cst are concurrently (e.g., simultaneously) formed using the same mask (e.g., a single mask), and thus the number of mask processes may be reduced.

Figure 19:
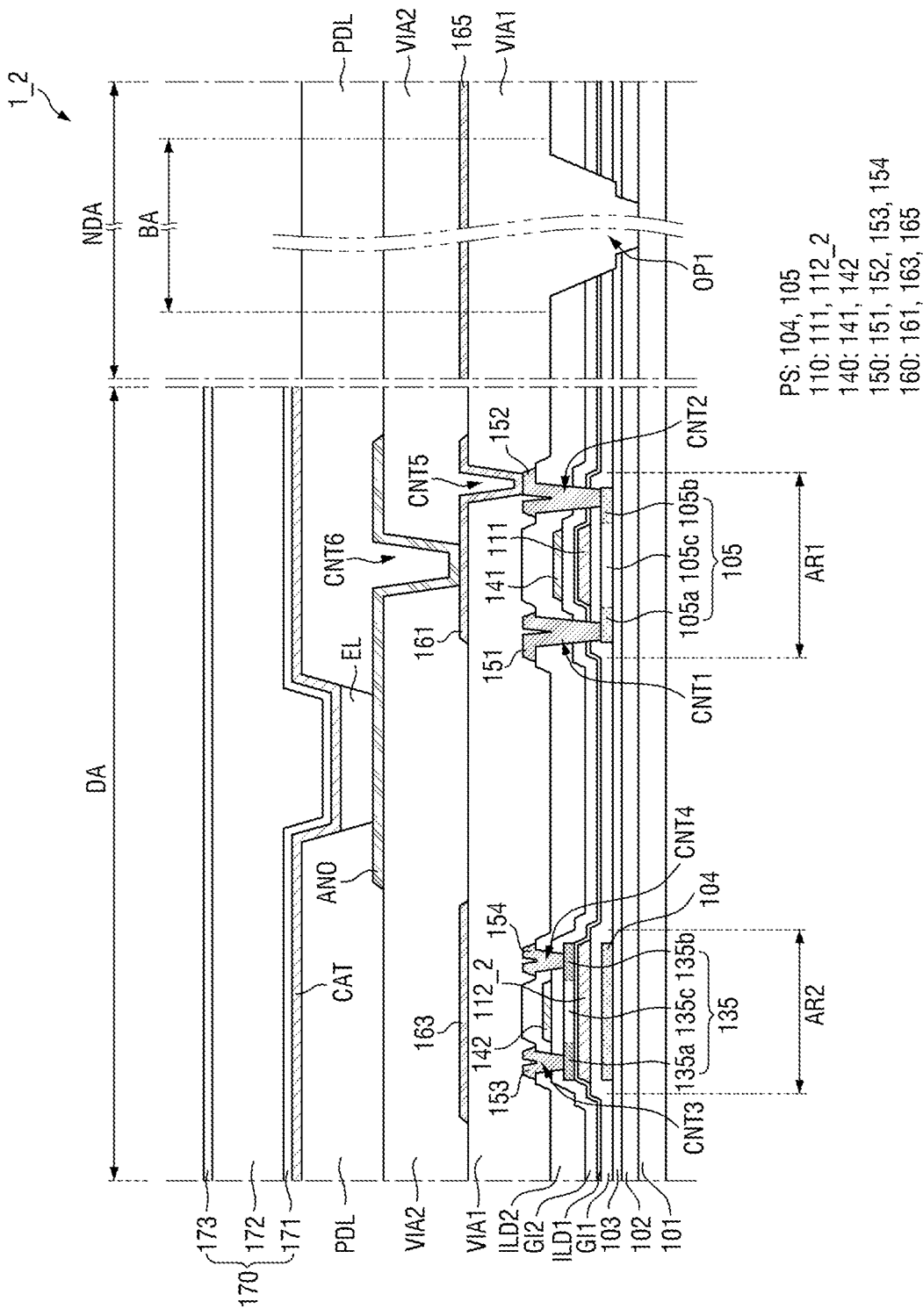
FIG. 19 is a cross-sectional view of a display device according to still another embodiment.

FIG. 19 is a cross-sectional view of a display device according to still another embodiment.

Referring to FIG. 19, a display device 1_2 according to the illustrated embodiment is different from the display device in the embodiment of FIG. 18 in that the display device 1_2 includes a silicon lower light-shielding pattern 104 as well as a metal lower light-shielding pattern 112_2.

Specifically, the display device 1_2 according to the illustrated embodiment may include both of the silicon lower light-shielding pattern 104 disposed in an oxide transistor region AR2 and the metal lower light-shielding pattern 112_2. The silicon lower light-shielding pattern 104 may be formed to be coplanar with a silicon semiconductor layer 105 of a silicon semiconductor, and the metal lower light-shielding pattern 112_2 may be disposed above the silicon lower light-shielding pattern 104 while at least partially overlapping (e.g., in a thickness direction) the silicon lower light-shielding pattern 104.

Furthermore, in the illustrated embodiment, a second gate electrode 142 and a second electrode 141 of a capacitor Cst are concurrently (e.g., simultaneously) formed using the same mask, and thus the number of mask processes may be reduced.

Figure 20:
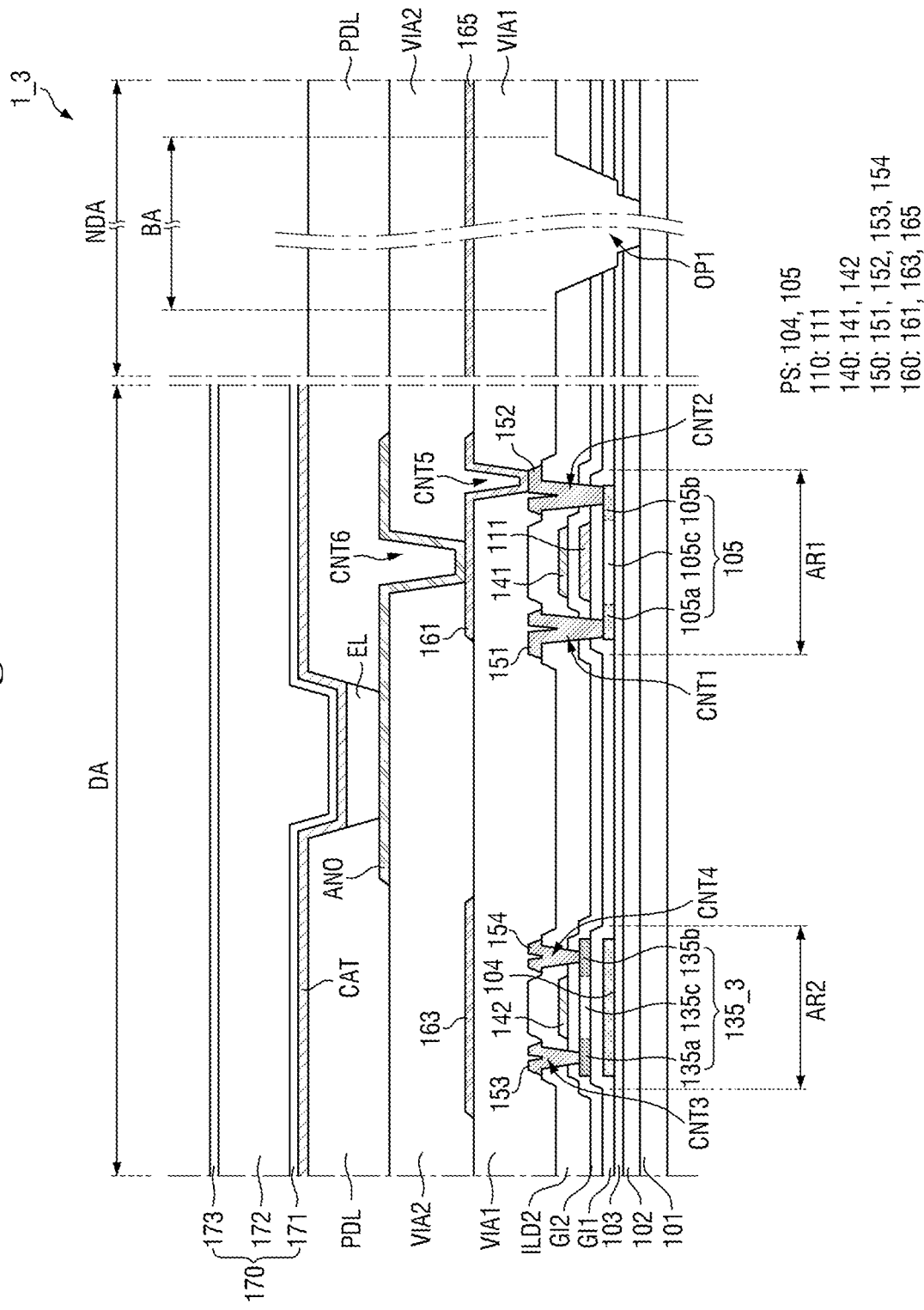
FIG. 20 is a cross-sectional view of a display device according to yet another embodiment.

FIG. 20 is a cross-sectional view of a display device according to yet another embodiment.

Referring to FIG. 20, a display device 1_3 according to the illustrated embodiment is different from the display device in the embodiment of FIG. 4 in that an oxide semiconductor layer 135_3 disposed in an oxide transistor region AR2 is disposed on a first gate insulating film GI1.

Specifically, as illustrated in FIG. 4, a first interlayer insulating film ILD1 may be disposed on a first gate electrode 111 disposed in a silicon transistor region AR1. Unlike the embodiment of FIG. 4 in which the oxide semiconductor layer 135 disposed in the oxide transistor region AR2 is disposed on the first interlayer insulating film ILD1, the oxide semiconductor layer 135_3 disposed in the oxide transistor region AR2 in the illustrated embodiment may be disposed on the first gate insulating film GI1 and may be formed to be coplanar with the first gate electrode 111 disposed in the silicon transistor region AR1. In other words, both of the first gate electrode 111 and the oxide semiconductor layer 135_3 may be disposed on the same insulating film (e.g., the first gate insulating film GI1).

Further, only one insulating layer (e.g., a second gate insulating film GI2) may be located between the first gate electrode 111 and the capacitor Cst and the second electrode 141, and thus a distance between a first electrode of a capacitor Cst connected to the first gate electrode 111 and a second electrode 141 of the capacitor Cst may be reduced. Therefore, the capacitance of the capacitor Cst formed between the first electrode of the capacitor Cst connected to the first gate electrode 111 and the second electrode 141 of the capacitor Cst may be further increased.

Furthermore in the illustrated embodiment, the second gate electrode 142 and the second electrode 141 of the capacitor Cst are concurrently (e.g., simultaneously) formed using the same mask, and thus the number of mask processes may be reduced.

Figure 21:
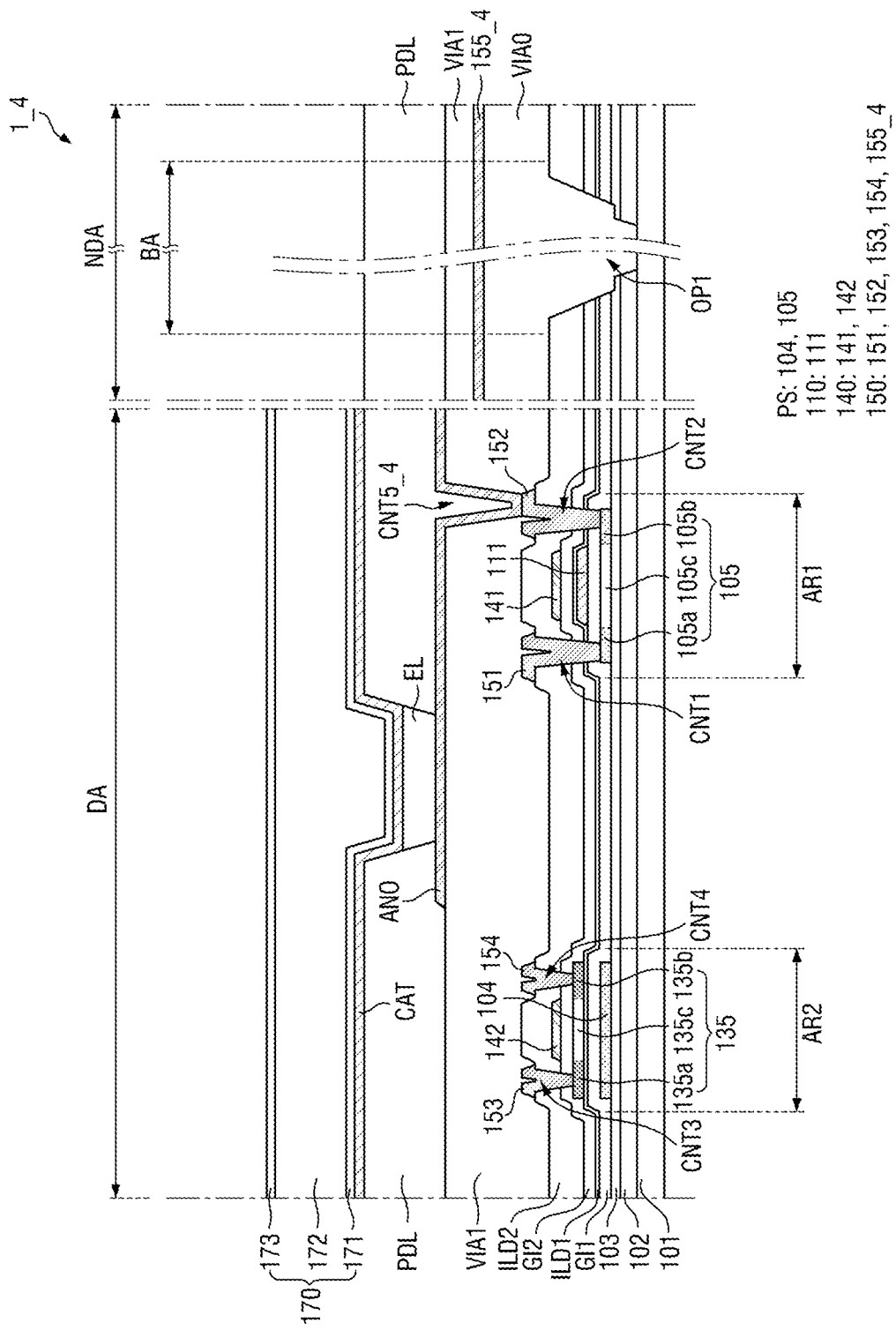
FIG. 21 is a cross-sectional view of a display device according to yet another embodiment.

FIG. 21 is a cross-sectional view of a display device according to yet another embodiment.

Referring to FIG. 21, a display device 1_4 according to the illustrated embodiment is different from the display device in the embodiment of FIG. 18 in that the display device 1_4 does not include a second via layer VIA2 and a fourth conductive layer 160 and does include a bending via layer VIA0 in a non-display region NDA.

Specifically, in the non-display region NDA, a bending opening OP1 may be filled with the bending via layer VIA0 instead of a first via layer VIA1. The bending via layer VIA0 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, and/or the like. The bending via layer VIA0 may be a single film or a multilayer film formed as a stacked film of different materials. The bending via layer VIA0 may be made of the same material as the first via layer VIA1, but the present disclosure is not limited thereto.

A non-display region line 155_4 may be disposed on the bending via layer VIA0. The non-display region line 155_4 may be formed of a third conductive layer 150. The non-display region line 155_4 may be formed together with the first and second source/drain electrodes 151 and 152 of the transistor disposed in the silicon transistor region AR1 and the first and second source/drain electrodes 153 and 154 of the transistor disposed in the oxide transistor region AR2, which are described above, and may be made of the same material as the materials forming the components 151, 152, 153, and 154.

The first via layer VIA1 may be disposed on the non-display region line 155_4, and the first via layer VIA1 may be formed concurrently (e.g., simultaneously) with a first via layer VIA1 in a display region DA to have substantially the same height as a height of the first via layer VIA1 of the display region DA.

In the display region DA, an anode electrode ANO and a pixel definition film PDL may be formed on the first via layer VIA1 and the anode electrode ANO may be stacked in a fifth contact hole CNT5_4.

Furthermore in the illustrated embodiment, a second gate electrode 142 and a second electrode 141 of a capacitor Cst are concurrently (e.g., simultaneously) formed using the same mask, and thus the number of mask processes may be reduced.

Hereinafter, a method of manufacturing the display device according to the embodiment of FIG. 21 will be described.

Figure 22:
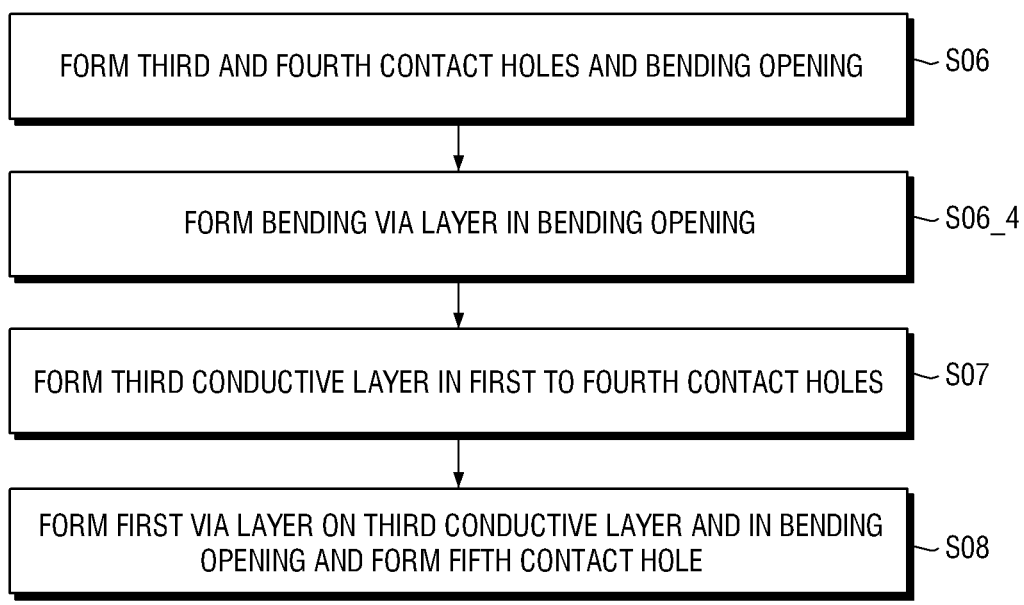
FIG. 22 is a partial flowchart illustrating a method of manufacturing the display device according to the embodiment of FIG. 21.
Figure 23:
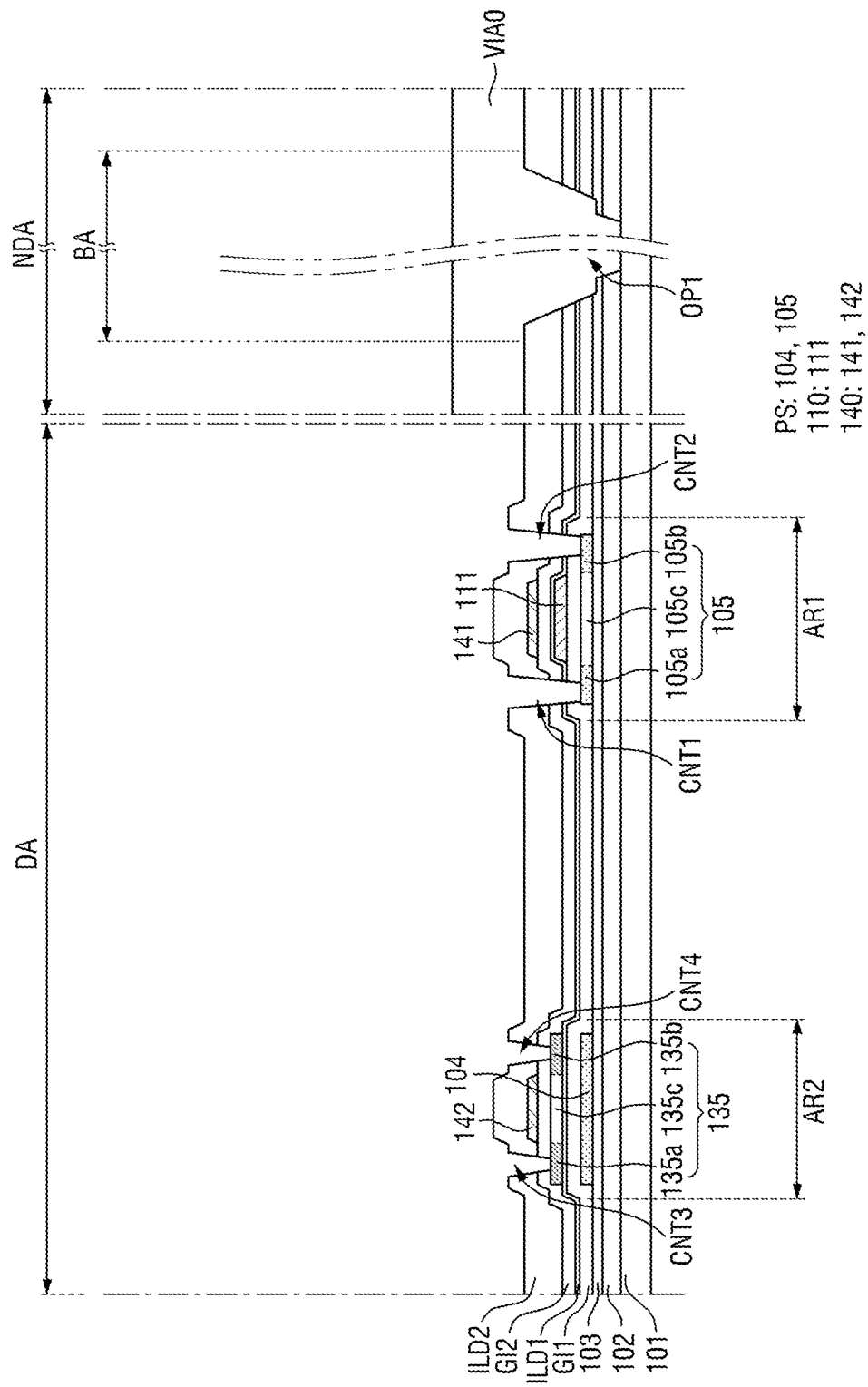
FIGS. 23-25 are cross-sectional views illustrating process operations of the method of manufacturing the display device according to the embodiment of FIG. 21.
Figure 24:
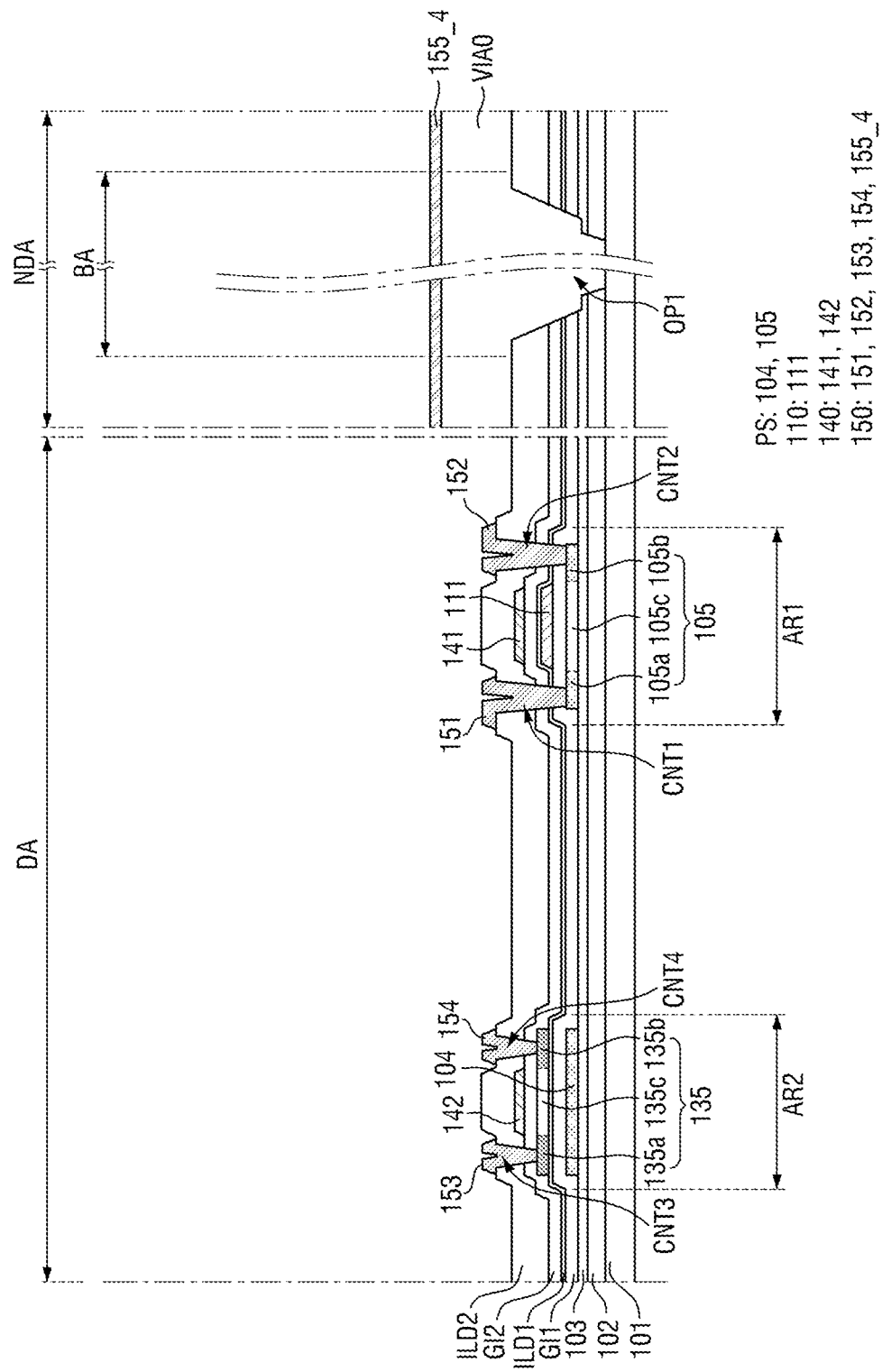
Figure 25:
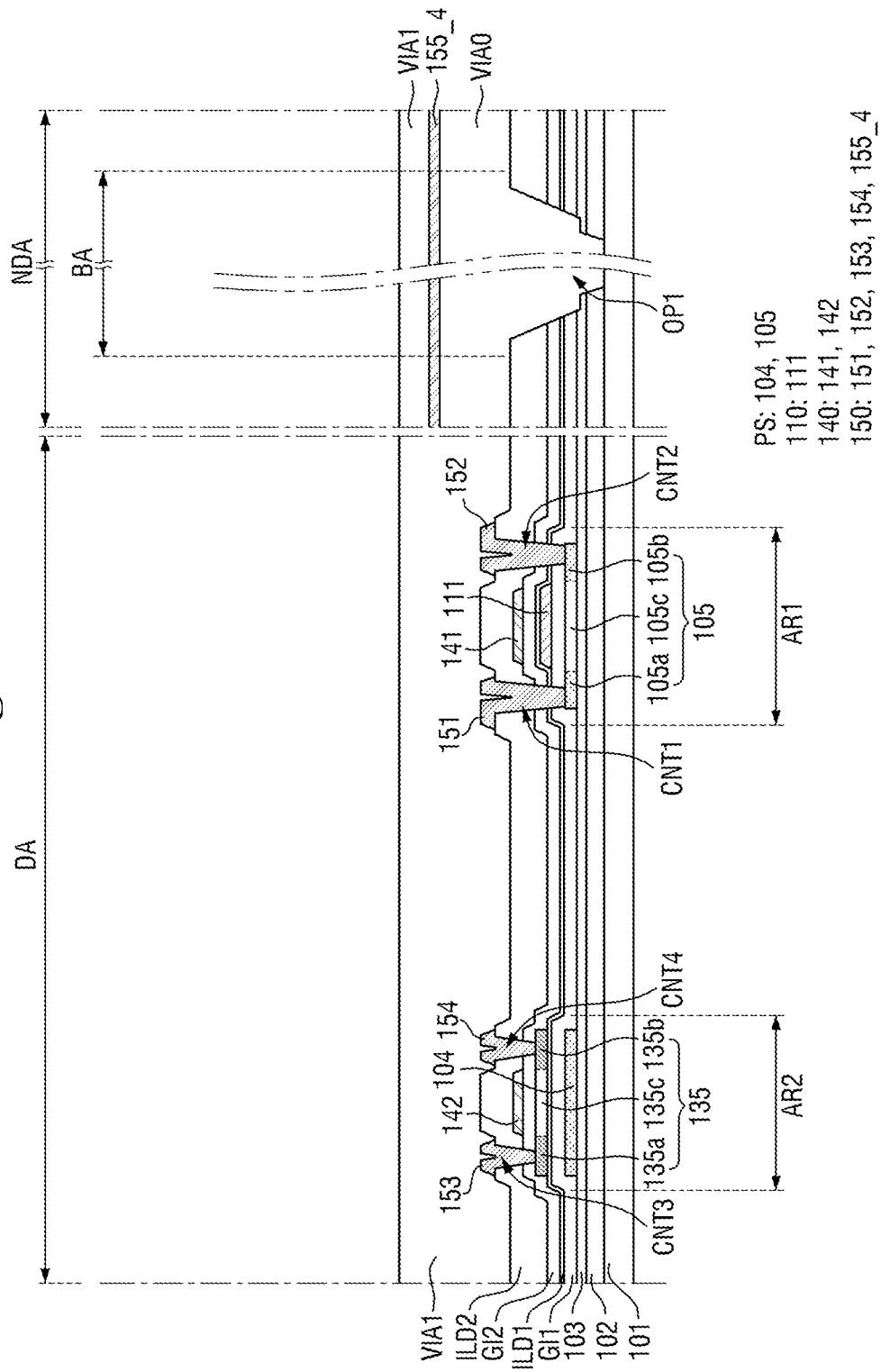

FIG. 22 is a partial flowchart illustrating the method of manufacturing the display device according to the embodiment of FIG. 21. FIGS. 23-25 are cross-sectional views illustrating process operations of the method of manufacturing the display device according to the embodiment of FIG. 21.

Referring to FIGS. 22 and 23, as described above, a bending opening OP1 may be formed by operations S05 and S06 of forming first to fourth contact holes CNT1, CNT2, CNT3, and CNT4. After the operations S05 and S06, a bending via layer VIA0 may be formed in the bending opening OP1 (S06_4). The bending opening OP1 may be filled with the bending via layer VIA0, and the bending via layer VIA0 may be in contact with an upper surface of a base substrate 101 in the bending opening OP1 and in contact with side surfaces of a barrier layer 102, a buffer layer 103, a first gate insulating film GI1, a first interlayer insulating film ILD1, a second gate insulating film GI2, and a second interlayer insulating film ILD2 and an upper surface of the second interlayer insulating film ILD2.

Subsequently, referring to FIGS. 24 and 25, a third conductive layer 150 may be formed on the second interlayer insulating film ILD2 and the bending via layer VIA0 (S07). The third conductive layer 150 may include first and second source/drain electrodes 151 and 152 of a transistor disposed in a silicon transistor region AR1, first and second source/drain electrodes 153 and 154 of a transistor disposed in an oxide transistor region AR2, and a non-display region line 155_4 disposed on the bending via layer VIA0.

A first via layer VIA1 may be formed on the third conductive layer 150 (S08). The first via layer VIA1 may have the same height in a display region DA and a non-display region NDA.

While the embodiments of the present disclosure have been described with reference to the accompanying drawings, it will be understood by those skilled in the art that various modifications can be made without departing from the scope of the present disclosure and without changing essential features as set forth in the claims and their equivalents. Therefore, the above-described embodiments should be considered in a descriptive sense only and not for purposes of limitation.

What is claimed is:

1. A display device comprising:
   a substrate;
   a first semiconductor layer on the substrate;
   a first gate insulating film on the first semiconductor layer;
   a first conductive layer on the first gate insulating film and comprising a first gate electrode and a first electrode of a capacitor connected to the first gate electrode;
   a first interlayer insulating film on the first conductive layer;
   a second semiconductor layer on the first interlayer insulating film and at a different layer from the first semiconductor layer;
   a second gate insulating film on the first conductive layer and the second semiconductor layer;
   a second conductive layer on the second gate insulating film and comprising a second gate electrode overlapping the second semiconductor layer and a second electrode of the capacitor overlapping the first electrode of the capacitor;
   a second interlayer insulating film on the second conductive layer; and
   a third conductive layer on the second interlayer insulating film and comprising a first source electrode and a first drain electrode connected to the first semiconductor layer and a second source electrode and a second drain electrode connected to the second semiconductor layer,
   wherein the first interlayer insulating film is between the first conductive layer and the second semiconductor layer.

2. The display device of claim 1, wherein the second gate insulating film is between the first gate electrode and the second electrode of the capacitor and the second gate insulating film is between the second semiconductor layer and the second gate electrode.

3. The display device of claim 1, further comprising a lower light-shielding pattern which overlaps at least a portion of the second semiconductor layer,
   wherein the lower light-shielding pattern is below the second semiconductor layer.

4. The display device of claim 3, wherein the lower light-shielding pattern is coplanar with the first semiconductor layer and comprises the same material as the first semiconductor layer.

5. The display device of claim 3,
   wherein the first interlayer insulating film is between the lower light-shielding pattern and the second semiconductor layer.

6. The display device of claim 5, wherein the lower light-shielding pattern comprises a metal lower light-shielding pattern that is coplanar with the first gate electrode and comprises the same material as the first gate electrode.

7. The display device of claim 1, wherein the second semiconductor layer is above the first conductive layer.

8. The display device of claim 1, wherein a plurality of insulating films are between the first gate electrode and the second electrode of the capacitor, and at least one of the plurality of insulating films is between the second semiconductor layer and the second gate electrode.

9. The display device of claim 3, wherein the lower light-shielding pattern is connected to the second gate electrode or is connected to any one of the second source electrode and the second drain electrode.

10. A display device comprising:
    a first transistor comprising a non-oxide semiconductor on a first layer;
    a second transistor comprising an oxide semiconductor on a second layer different from the first layer that the non-oxide semiconductor is on; and
    a capacitor,
    wherein a first electrode of the capacitor and a gate electrode of the first transistor are formed of a first conductive layer, the first electrode of the capacitor being connected to the gate electrode of the first transistor,
    wherein a gate electrode of the second transistor and a second electrode of the capacitor are formed of a second conductive layer different from the first conductive layer,
    wherein a source/drain electrode of the first transistor and a source/drain electrode of the second transistor are formed of a third conductive layer different from the first conductive layer and the second conductive layer,
    wherein the gate electrode of the second transistor and the second electrode of the capacitor are coplanar, and
    wherein an interlayer insulating film is between the gate electrode of the first transistor and the oxide semiconductor of the second transistor.

11. The display device of claim 10, wherein the first transistor is a p-type metal-oxide-semiconductor (PMOS) transistor and the second transistor is an n-type metal-oxide-semiconductor (NMOS) transistor, or
    wherein the first transistor is an NMOS transistor and the second transistor is a PMOS transistor.

12. The display device of claim 10, further comprising a lower light-shielding pattern overlapping at least a portion of the non-oxide semiconductor of the second transistor,
    wherein the lower light-shielding pattern is below the second transistor.

13. The display device of claim 12, wherein the lower light-shielding pattern is coplanar with the non-oxide semiconductor of the first transistor and comprises the same material as the non-oxide semiconductor of the first transistor.

* * * * *